(12) United States Patent
Nii

(10) Patent No.: US 6,917,560 B2
(45) Date of Patent: Jul. 12, 2005

(54) REDUCTION OF CAPACITIVE EFFECTS IN A SEMICONDUCTOR MEMORY DEVICE

(75) Inventor: Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/691,707

(22) Filed: Oct. 24, 2003

(65) Prior Publication Data

US 2004/0218455 A1 Nov. 4, 2004

(30) Foreign Application Priority Data

Apr. 30, 2003 (JP) .......................................... 2003-125401

(51) Int. Cl.[7] .................................................. G11C 8/00
(52) U.S. Cl. .................................... 365/230.05; 365/63
(58) Field of Search ............................... 365/63, 230.05, 365/154, 156

(56) References Cited

U.S. PATENT DOCUMENTS 5,586,072 A * 12/1996 Longway et al. ............. 365/63
5,877,976 A * 3/1999 Lattimore et al. ............ 365/63
5,966,317 A * 10/1999 O'Connor ..................... 365/53

FOREIGN PATENT DOCUMENTS

| JP | P2000-12704 | 1/2000 |
| JP | P2000-236029 | 8/2000 |
| JP | P2002-43441 | 2/2002 |
| JP | P2002-237539 | 8/2002 |

* cited by examiner

Primary Examiner—Gene N. Auduong
(74) Attorney, Agent, or Firm—McDermott Will & Emery LLP

(57) ABSTRACT

A semiconductor memory device having a multiport memory includes a plurality of memory cells MC arranged in columns and rows, a plurality of first word lines WLA0–WLAn connected to a first port 13a, and a plurality of second word lines WLB0–WLBn connected to a second port 13b. Each of a plurality of first word lines WLA0–WLAn and each of a plurality of second word lines WLB0–WLBn are arranged alternately in a planar layout. A semiconductor memory device is thus obtained that allows a coupling noise between interconnections to be reduced without an increase in memory cell area.

5 Claims, 23 Drawing Sheets

REDUCTION OF CAPACITIVE EFFECTS IN A SEMICONDUCTOR MEMORY DEVICE

BACKGROUND OF THE INVENTION

1. Field of the Invention

The present invention relates to a semiconductor memory device, and more particularly to an SRAM (Static Random Access Memory) semiconductor memory device having a multiport memory or a content addressable memory.

2. Description of the Background Art

In multiport memory cells, bit lines or word lines of each port are often arranged adjacent to each other. Therefore, the coupling capacitance between interconnections may cause crosstalk, resulting in a malfunction.

Japanese Patent Laying-Open No. 2000-12704, for example, proposes a method of avoiding interference of word lines with each other by providing GND interconnections for write word lines and read word lines. Similarly, Japanese Patent Laying-Open No. 2000-236029 proposes a method of avoiding interference between word lines by providing a GND interconnection between rows of memory cells adjacent to each other.

Both of these approaches require a sufficient space between a word line and a word line, since a shielding interconnection is provided between word lines. If there is originally a gap between word lines in memory cells, provision of the shielding interconnection does not increase the area. In a layout configuration of a two-port memory cell that is long in a lateral direction, as shown in Japanese Patent Laying-Open Nos. 2002-43441 and 2002-237539, for example, the word lines connected to each port are arranged adjacent to each other, and if the space therebetween is small, there is no room to be provided with the shielding interconnection.

In view of the forgoing, if the shielding interconnection is inserted in the layout configuration of the laterally long two-port memory cell, the memory cell area is inevitably increased, accordingly.

If the shielding interconnection is not provided, the increased coupling capacitance between word lines as described above increases the coupling noise, which causes a malfunction.

SUMMARY OF THE INVENTION

An object of the present invention is to provide a semiconductor memory device allowing coupling noise between interconnections to be reduced without increasing a memory cell area.

In accordance with the present invention, a semiconductor memory device having a multiport memory includes a plurality of memory cells, a plurality of first word lines, and a plurality of second word lines. The plurality of memory cells are arranged in columns and rows. Each of the plurality of first word lines is arranged corresponding to each row, is electrically connected to the memory cell, and is selected in accordance with an address signal from a first port when accessed from the first port. Each of the plurality of second word lines is arranged corresponding to each row, is electrically connected to the memory cell, and is selected in accordance with an address signal from a second port when accessed from the second port. Each of the plurality of first word lines and each of the plurality of second word lines are arranged alternately in a planar layout.

In the semiconductor memory device in accordance with the present invention, each of a plurality of first word lines and each of a plurality of second word lines are arranged alternately in a planar layout. Therefore, a word line adjacent to one side of any given word line and a word line adjacent to the other side thereof belong to the same port. These word lines of the same port are not selected at a time by a row select address signal, and one of these word lines is fixed at a "L (low)" level by a word line driver circuit. Thus, the coupling capacitance on the one side of the word line changes, while the coupling capacitance on the other side does not change, thereby having no effect on the potential on that word line. Therefore, the word line can be less affected by the coupling capacitance as compared with the case where the word line is affected by the coupling capacitance on both sides. Accordingly, it is possible to reduce the coupling noise and to prevent a malfunction without increasing the memory cell area.

In accordance with another aspect of the present invention, a semiconductor memory device having a content addressable memory includes a plurality of content addressable memory cells, a plurality of word lines, and a plurality of match lines. The plurality of content addressable memory cells are arranged in columns and rows. Each of the plurality of word lines is arranged corresponding to each row and is electrically connected to the content addressable memory cell. Each of the plurality of match lines is arranged corresponding to each row and is electrically connected to the content addressable memory cell. In a first row and a second row adjacent to each other, the word line in the first row and the word line in the second row are adjacent to each other, and in the second row and a third row adjacent to each other, the match line in the second row and the match line in the third row are adjacent to each other.

In the semiconductor memory device in accordance with another aspect of the present invention, in a first row and a second row adjacent to each other, the word line in the first row and the word line in the second row are adjacent to each other, and in the second row and a third row adjacent to each other, a match line in the second row and a match line in the third row are adjacent to each other. Therefore, the word line is less affected by the coupling capacitance, thereby reducing the coupling noise and preventing a malfunction without increasing the memory cell area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the figures.

(First Embodiment)

Figure 1:
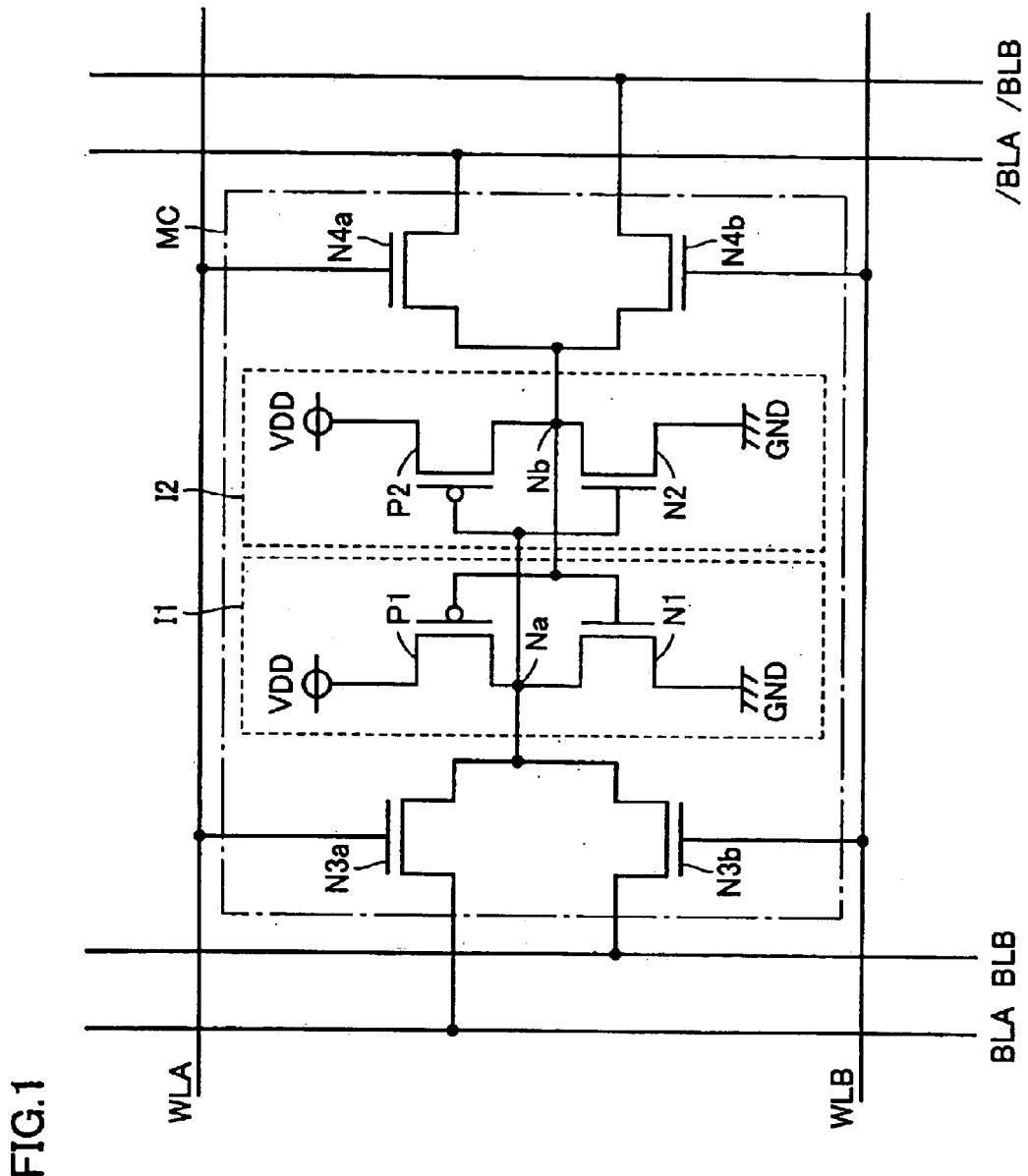
FIG. 1 is a circuit diagram showing an equivalent circuit of a two-port SRAM memory cell in a first embodiment of the present invention.

Referring to FIG. 1, memory cell MC has two driver transistors N1, N2, two load transistors P1, P2, and four access transistors N3a, N3b, N4a, N4b.

Each of two driver transistors N1, N2, and four access transistors N3a, N3b, N4a, N4b is formed of an NMOS transistor, and each of two load transistors P1, P2 is formed of a pMOS transistor.

NMOS transistor N1 and pMOS transistor P1 constitute a first CMOS (Complementary Metal Oxide Semiconductor) inverter I1, and nMOS transistor N2 and pMOS transistor P2 constitute a second CMOS inverter I2. A flip-flop circuit and storage nodes Na, Nb are formed by connecting the output terminal of one of first and second inverters I1 and I2 to the input terminal of the other.

The source of each of driver transistors N1, N2 is connected to a GND potential and the source of each of load transistors P1, P2 is connected to a VDD potential.

The source, gate, and drain of nMOS transistor N3a are connected to one storage terminal Na, a first word line WLA, and a first positive-phase bit line BLA, respectively. The source, gate, and drain of nMOS transistor N3b is connected to one storage terminal Na, a second word line WLB, and a second positive-phase bit line BLB, respectively.

The source, gate, and drain of nMOS transistor N4a are connected to one storage terminals Nb, first word line WLA, and a first negative-phase bit line/BLA, respectively. The source, gate, and drain of nMOS transistor N4b are connected to one storage terminal Nb, second word line WLB, and a second negative-phase bit line/BLB, respectively.

In other words, reading of a stored value by a first port is enabled by selecting first word line WLA, first positive-phase bit line BLA, and first negative-phase bit line/BLA. Reading of a stored value by a second port is enabled by selecting second word line WLB, second positive-phase bit line BLB, and second negative-phase bit line/BLB.

A two-port SRAM memory cell circuit is configured by the connection as described above.

Figure 2:
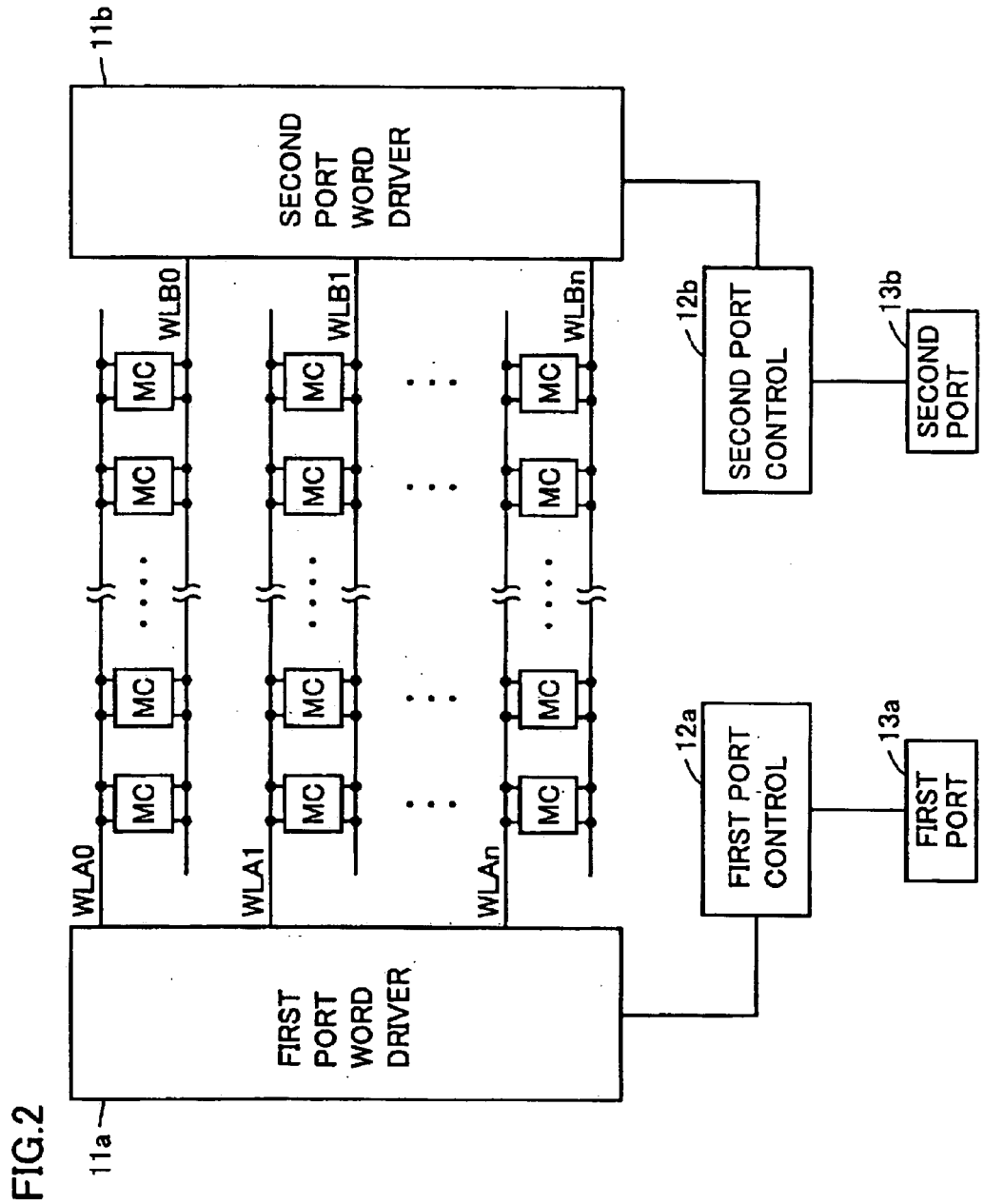
FIG. 2 is a diagram showing a manner of arrangement of the two-port SRAM memory cells MC in FIG. 1.

Referring to FIG. 2, two-port SRAM memory cells MC shown in FIG. 1 are arranged in columns and rows (in matrix) in a memory array. Corresponding to each row of the memory array, each of first word lines WLA0–WLAn and each of second word lines WLB0–WLBn are arranged. In other words, for each row, first word line WLA and second word line WLB are arranged as a pair.

Each of first word lines WLA0–WLAn is selected, for example, through a first port control 12a by a first port word driver 11a in accordance with an address signal from a first port 13a. Each of second word lines WLB0–WLBn is selected, for example, through a second port control 12b by a second port word driver 11b in accordance with an address signal from a second port 13b.

It is noted that bit lines are not shown in FIG. 2 for convenience of illustration. Furthermore, although first port word driver 11a is shown to the left of the memory cell array in the figure and second port word driver 11b is shown to the right of the memory cell array in the figure, the positions at which first and second port word drivers 11a, 11b are arranged are not limited thereto. Each of first port 13a and second port 13b is formed of input/output pins and input/output circuits.

Figure 3:
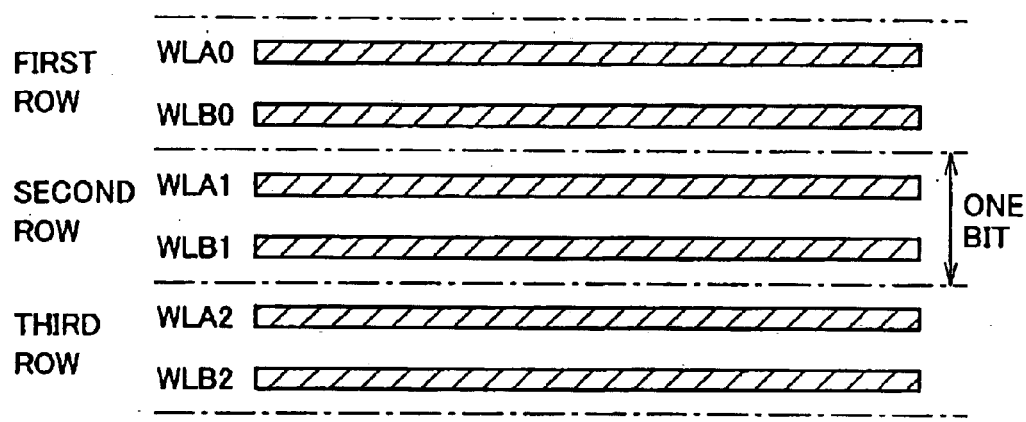
FIG. 3 is a planar layout diagram showing an arrangement of word lines where two-port SRAM memory cells are arranged in three rows in the first embodiment of the present invention.

Referring to FIG. 3, in the present embodiment, each of word lines WLA0–WLA2 electrically connected to the first port and each of word lines WLB0–WLB2 electrically connected to the second port are arranged alternately in the planar layout. In other words, the word lines are planarly arranged in the order of word line WLA0, word line WLB0, word line WLA1, word line WLB1, word line WLA2, and word line WLB2, from above in FIG. 3.

In accordance with the present embodiment, each of word lines WLA0–WLA2 and each of word lines WLB0–WLB2 are alternately arranged in the planar layout as described above, so that the coupling noise between the interconnections can be reduced without an increase in memory cell area. This will be described below.

Figure 4:
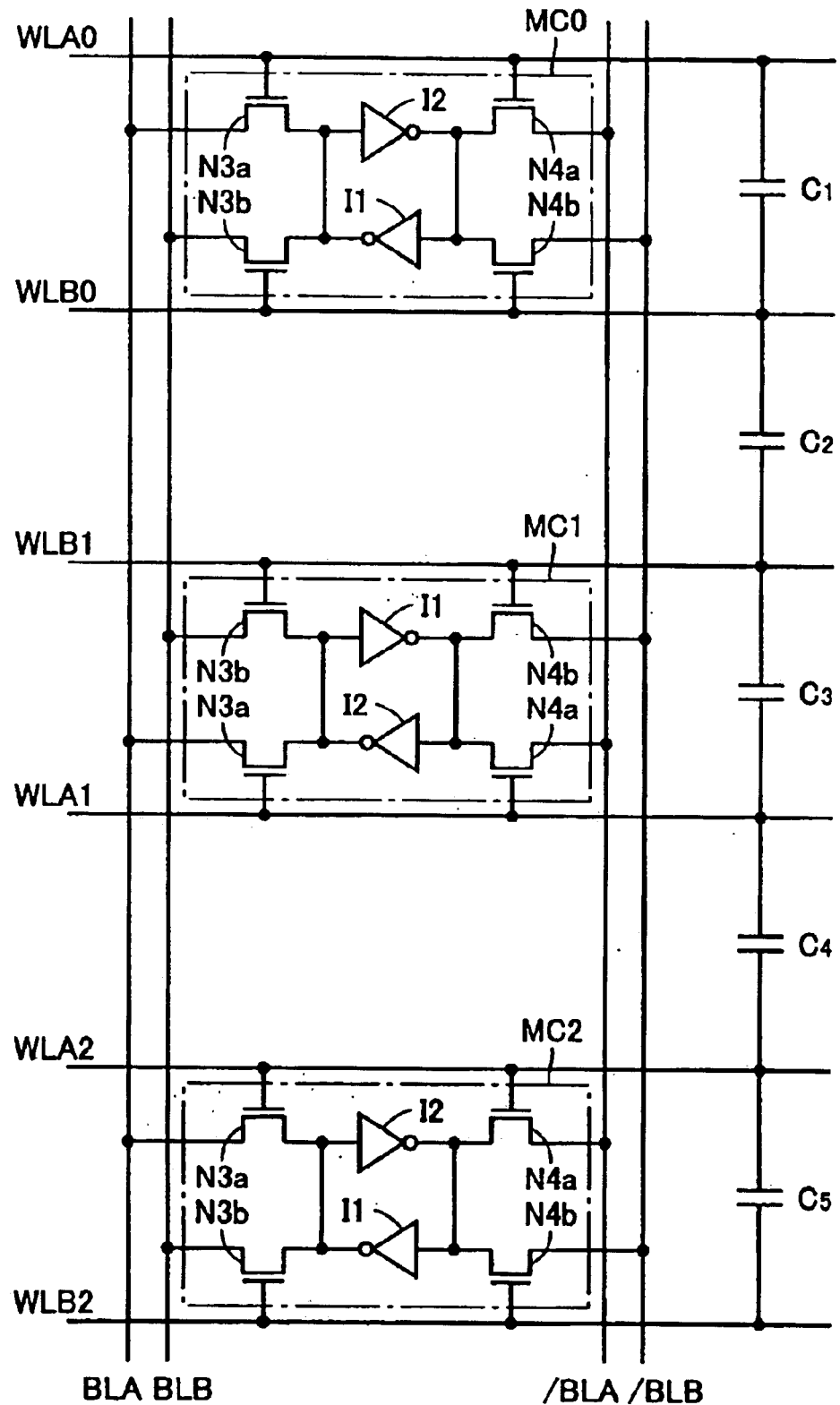
FIG. 4 is a diagram showing a circuit configuration of three bits where word lines connected to the same port are arranged to be adjacent to each other in the two-port memory cells.

First, for comparison with the present embodiment, a two-port SRAM memory cell with a word line arrangement in which word lines connected to the same port are adjacent to each other as shown in FIG. 4 will be described. FIG. 4 shows a circuit configuration of three bits where word lines connected to the same port are arranged adjacent to each other, in the two-port SRAM memory cells.

Referring to FIG. 4, in the case of this word line arrangement, the word lines from the first row to the third row, for example, are arranged in the order of word line WLA0, word line WLB0, word line WLB1, word line WLA1, word line WLA2, word line WLB2. Attention will be made to word line WLB1 of the second port in the first row. This word line WLB0 is adjacent to word line WLA0 on the one side and is adjacent to word line WLB1 on the other side. In other words, a word line adjacent to one side of any given word line belong to the same port and another row, and a word line adjacent to the other side thereof belongs to another port and the same row.

In such a word line arrangement, assume that the first row is selected by the row select address signal of the first port and word line WLA0 is raised from L (low) level to H (high) level. Also assume that at approximately the same timing, the second row is selected by the row select address signal of the second port and word line WLB1 is raised from L level to H level.

Figure 5:
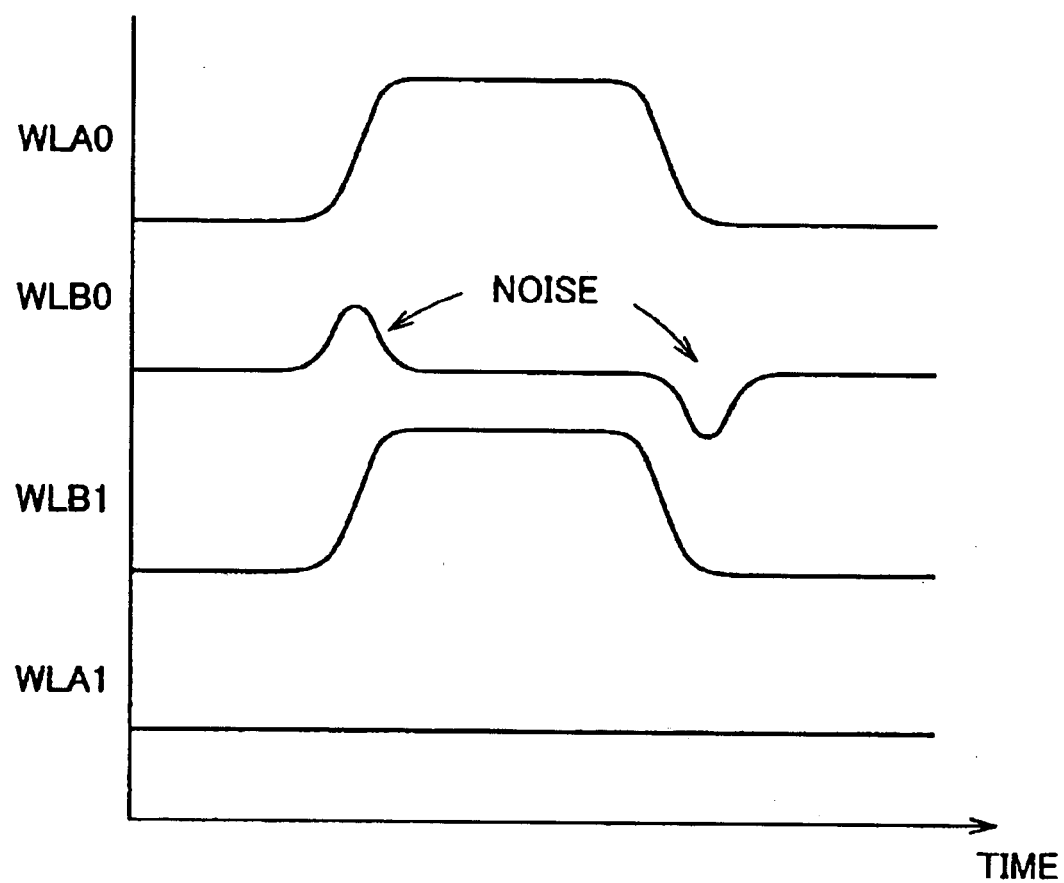
FIG. 5 is an operational waveform diagram of the word lines in the circuit configuration in FIG. 4.

The potential on word line WLB1 sandwiched between word line WLA0 and word line WLB1 is then affected by a coupling capacitance C1 caused between word lines WLB1 and WLA0 and a coupling capacitance C2 between word lines WLB0 and WLB1. As a result, the potential on word line WLB0 tends to change in the same manner as word lines WLA0, WLB1, as shown in FIG. 5.

Since word line WLB0 is driven to L level by the word line driver, the potential on word line WLB0 is momentarily raised but soon returns to L level. However, the change of the potential from L level, which is caused on word line WLB0 by the coupling capacitance, causes a coupling noise. If this noise occurs, access transistors N3b, N4b of memory cell MC0 connected to word line WLB0 will open momentarily. Therefore, it is likely that memory cell MC0 is erroneously written and the hold data in memory cell MC0 is corrupted.

On the contrary, in the present embodiment, as shown in FIG. 3, each of word lines WLA0–WLA2 and each of word lines WLB0–WLB2 are arranged alternately in the planar layout. Attention will be paid to word line WLB0 of the second port in the first row. This word line WLB0 is adjacent to word line WLA0 on one side and is adjacent to word line WLA1 on the other side. In other words, a word line adjacent to one side of any given word line and a word line adjacent to the other side thereof belong to the same port.

These word lines of the same port are not selected at a time by a row select address signal, and one of these word lines is fixed at L level by the word line driver circuit. Therefore, when word line WLA0 adjacent to the one side of word line WLB0 is selected, word line WLA1 adjacent to the other side is not selected.

Figure 6:
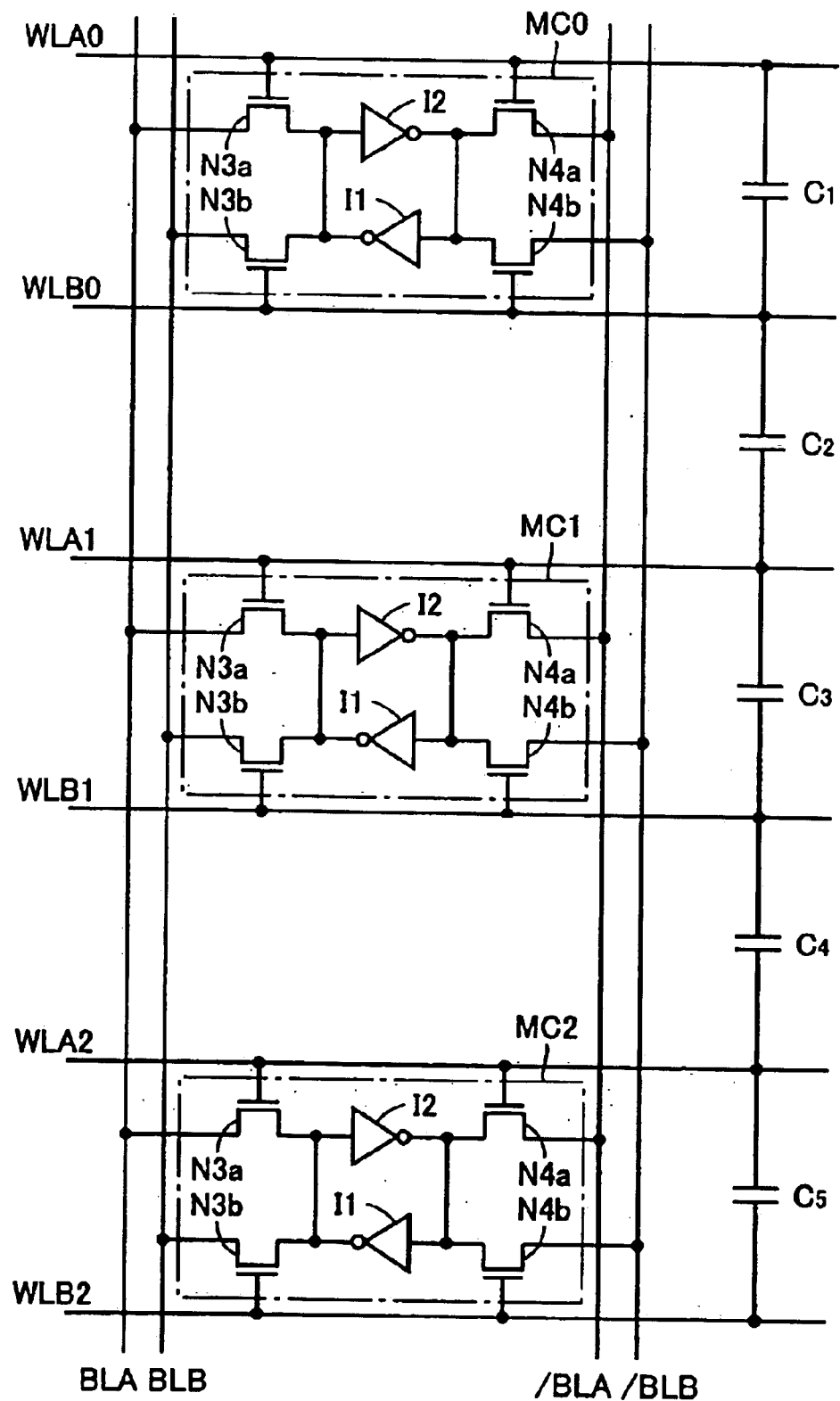
FIG. 6 is a diagram showing a circuit configuration of three bits of the two-port SRAM memory cells in the first embodiment of the present invention.
Figure 7:
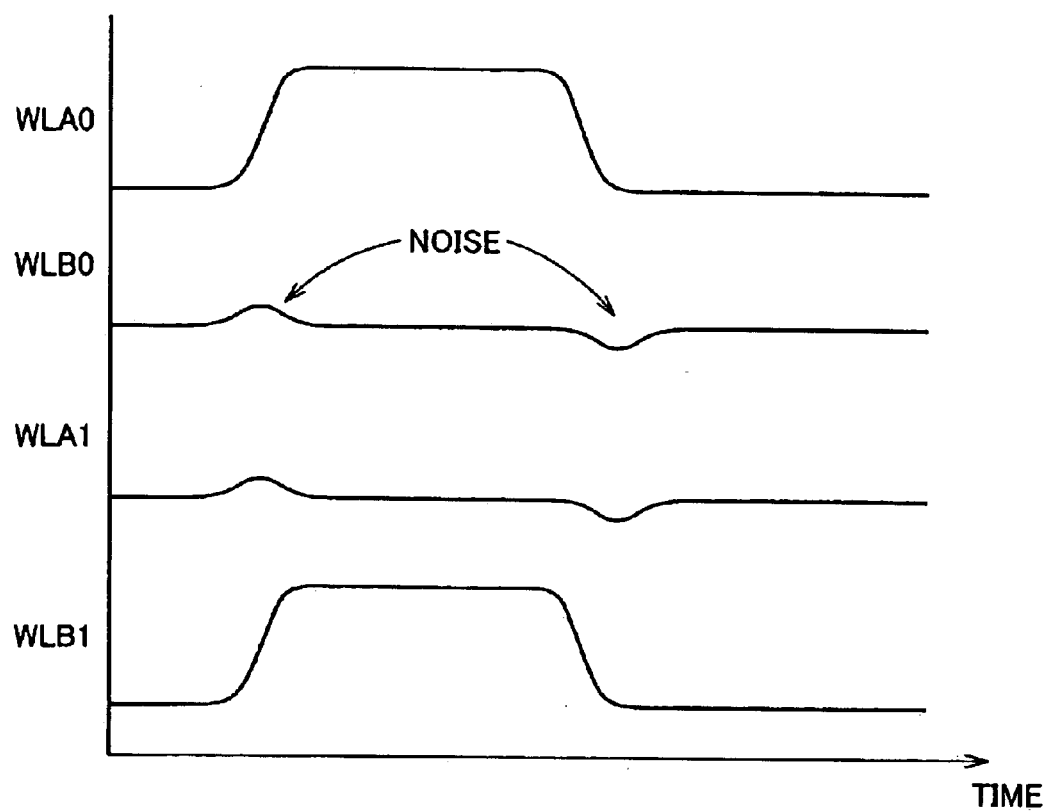
FIG. 7 is an operational waveform diagram of the word lines in the circuit configuration in FIG. 6.

Referring to FIG. 6, the change of the potential on word line WLA0 on the one side of word line WLB0 causes the change of coupling capacitance C1 between word line WLB0 and word line WLA0. Coupling capacitance C2 between word line WLB0 and word line WLA1, however, does not change and does not affect the potential on word line WLB0, since the potential on word line WLA1 on the other side of word line WLB0 is constantly at L level. Accordingly, in the present embodiment, since word line WLB0 is hardly affected by the coupling capacitance as shown in FIG. 7, it is possible to reduce the coupling noise as compared with the case shown in FIGS. 4 and 5, and to prevent a malfunction without increasing the memory cell area.

(Second Embodiment)

In the present embodiment, an exemplary layout configuration to realize the word line arrangement in the first embodiment will specifically be described.

A layout configuration of memory cell MC1 of one bit will be described.

Figure 8:
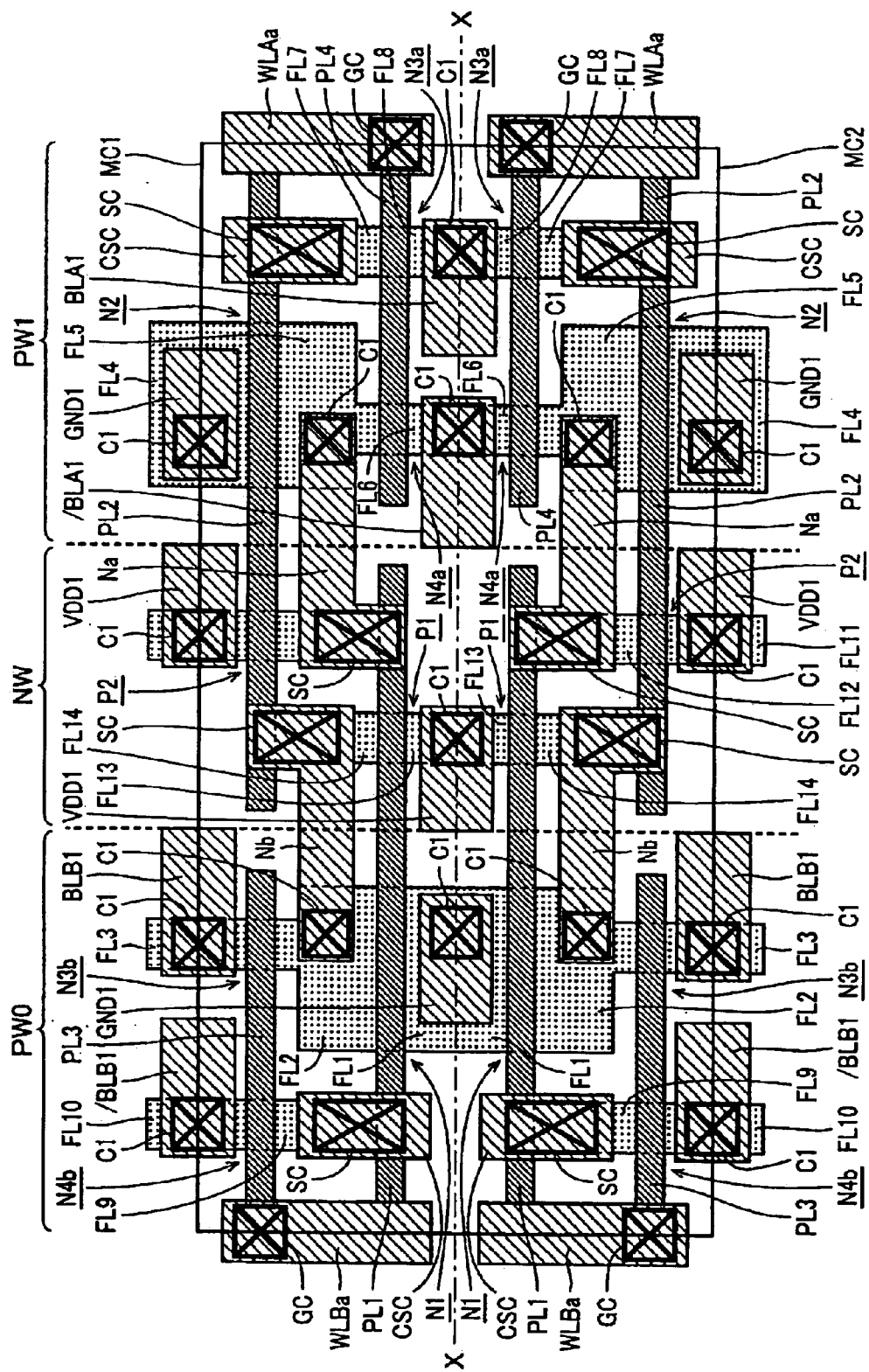
FIG. 8 is a planar view showing an exemplary layout configuration from a transistor formation layer to a first metal interconnection layer where two bits of the two-port SRAM memory cells are arranged in the same column in a second embodiment of the present invention.

Referring mainly to FIG. 8, one n-type well region NW as well as two p-type well regions PW0, PW1 with the n-type well region NW interposed therebetween are formed on a surface of a semiconductor substrate. PMOS transistors P1, P2 are formed in n-type well NW. NMOS transistors N1, N3b, N4b are formed in p-type well PW0, and nMOS-transistors N2, N3a, N4a are formed in p-type well PW1.

PMOS transistor P1 has the source formed of a p-type diffusion region FL13, the drain formed of a p-type diffusion region FL14, and gate PL1. PMOS transistor P2 has the source formed of a p-type diffusion region FL11, the drain formed of a p-type diffusion region FL12, and gate PL2.

NMOS transistor N1 has the source formed of an n-type diffusion region FL1, the drain formed of an n-type diffusion region FL2, and gate PL1. NMOS transistor N2 has the source formed of an n-type diffusion region FL4, the drain formed of an n-type diffusion region FL5, and gate PL2.

NMOS transistor N3a has the source formed of an n-type diffusion region FL7, the drain formed of an n-type diffusion region FL8, and gate PL4. NMOS transistor N3b has the source formed of an n-type diffusion region FL2, the drain formed of an n-type diffusion region FL3, and gate PL3.

NMOS transistor N4a has the source formed of an n-type diffusion region FL5, the drain formed of an n-type diffusion region FL6, and gate PL4. NMOS transistor N4b has the source formed of an n-type diffusion region FL9, the drain formed of an n-type diffusion region FL10, and gate PL3.

Each n-type diffusion region is formed by implanting an n-type impurity in the active region of p-type wells PW0, PW1. Each p-type diffusion region is formed by implanting a p-type impurity in the active region of n-type well NW.

N-type diffusion region FL2 of nMOS transistor N1 and n-type diffusion region FL2 of nMOS transistor N3b are formed of a common diffusion region. N-type diffusion region FL5 of nMOS transistor N2 and n-type diffusion region FL5 of nMOS transistor N4a are formed of a common diffusion region.

Gates PL1 of pMOS transistor P1 and nMOS transistor N1 are formed of a common doped polysilicon (polysilicon implanted with an impurity) interconnection. Gates PL2 of pMOS transistor P2 and NMOS transistor N2 are formed of a common doped polysilicon interconnection. Gates PL4 of nMOS transistors N3a and N4a are formed of a common doped polysilicon interconnection. Gates PL3 of NMOS transistors N3b and N4b are formed of a common doped polysilicon interconnection.

Gate PL1, p-type diffusion region FL12, and n-type diffusion region FL5 are electrically connected at low impedance by a first metal interconnection corresponding to storage terminal Na through a shared contact SC and a contact C1. Gate PL1 and n-type diffusion region FL9 are electrically connected by first metal interconnection CSC through shared contact SC.

Gate PL2, p-type diffusion region FL14, and n-type diffusion region FL2 are electrically connected at low impedance by a first metal interconnection corresponding to storage terminal Nb through shared contact SC and contact C1. Gate PL2 and n-type diffusion region FL7 are electrically connected by first metal interconnection CSC through shared contact SC.

Figure 9:
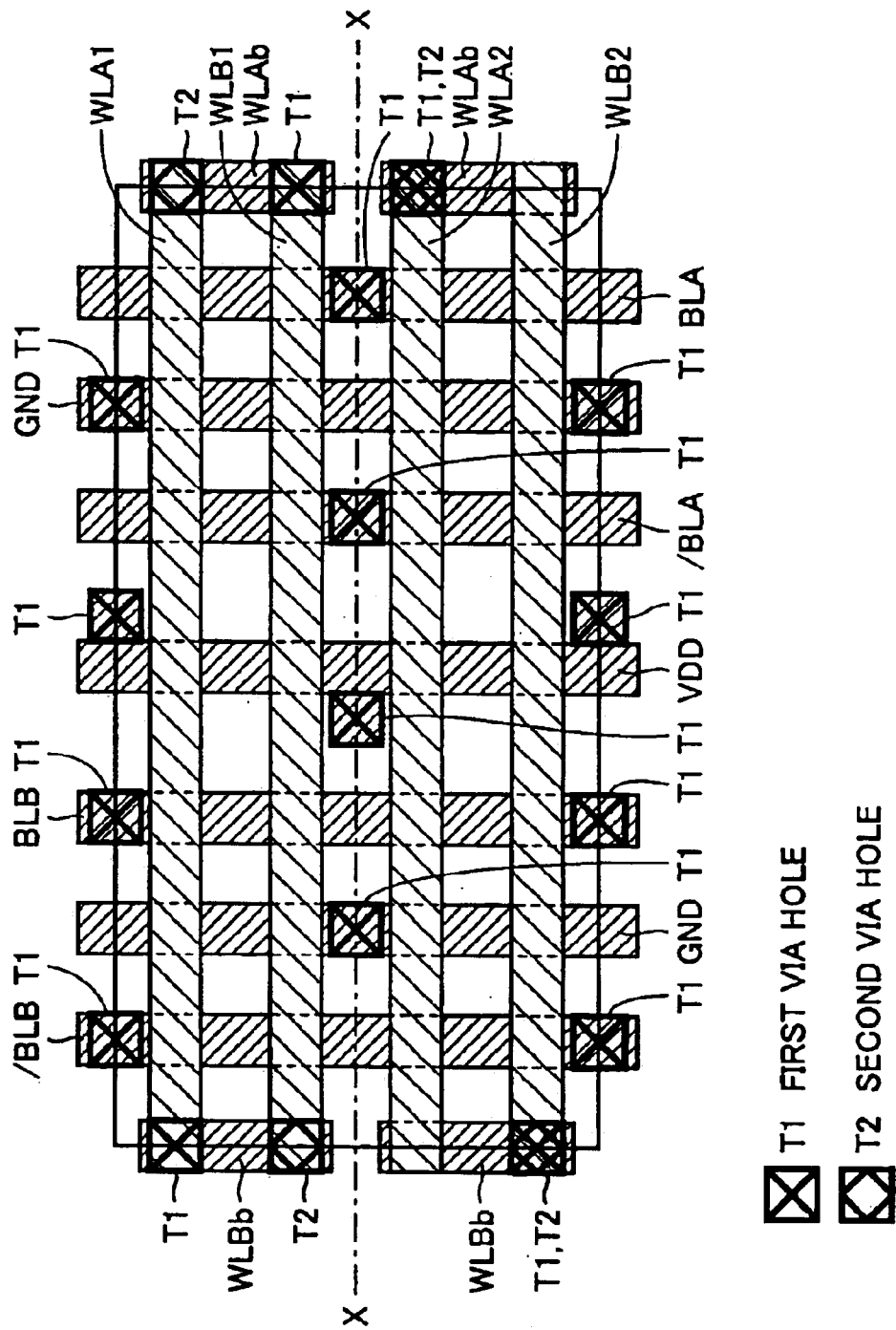
FIG. 9 is a planar view showing an exemplary layout configuration from a first via hole to a third metal interconnection layer where two bits of the two-port SRAM memory cells are arranged in the same column in the second embodiment of the present invention.
Figure 10:
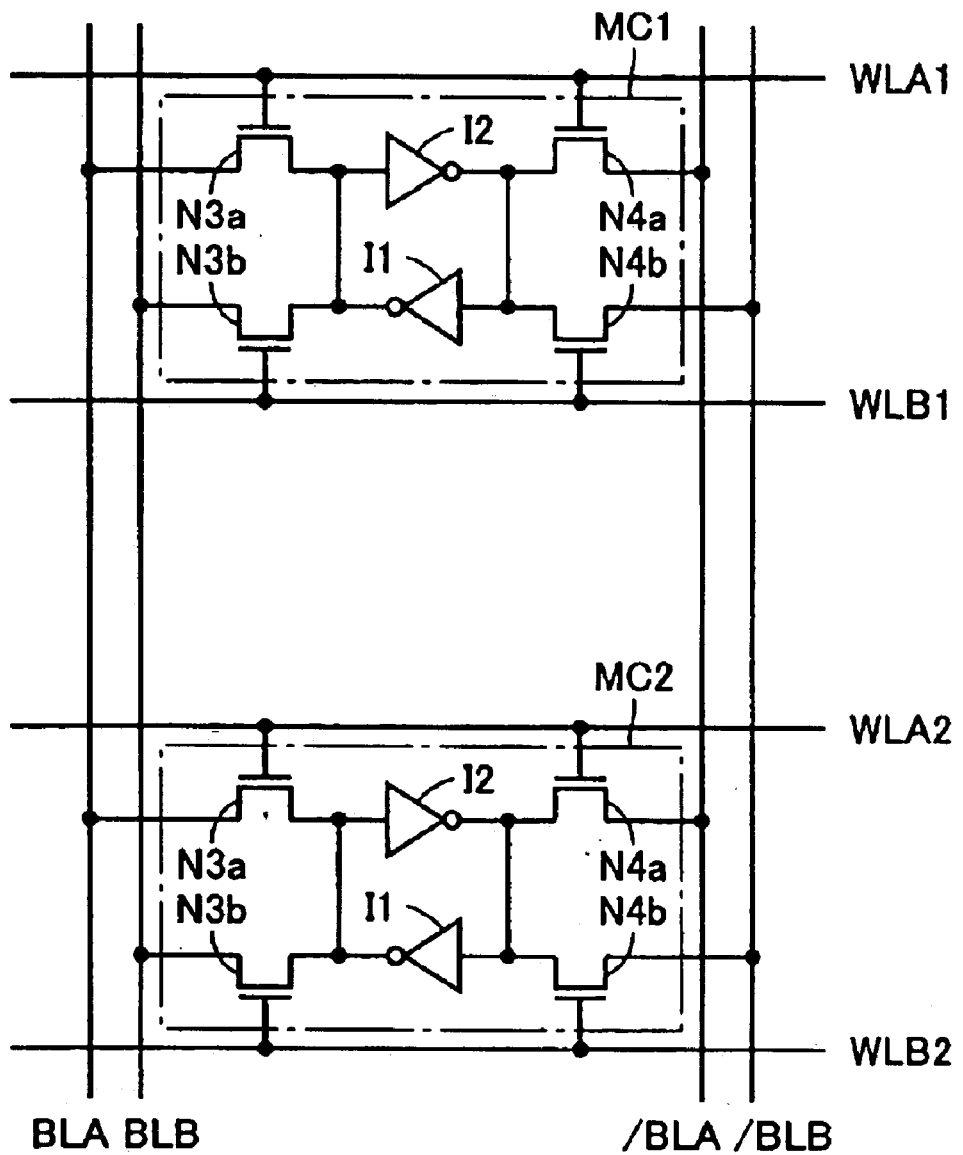
FIG. 10 is a circuit diagram showing an equivalent circuit of two bits of memory cells in FIGS. 8 and 9.

Referring mainly to FIGS. 8 and 9, p-type diffusion regions FL11 and FL13 are electrically connected to separate first metal interconnections VDD1 through contacts C1. Each of the separate first metal interconnections VDD1 is electrically connected to a second metal interconnection serving as VDD potential though first via hole T1.

N-type diffusion region FL8 is electrically connected to a first metal interconnection BLA1 through contact C1, and the first metal interconnection BLA1 is electrically connected to a second metal interconnection serving as a bit line BLA through first via hole T1. N-type diffusion region FL6 is electrically connected to a first metal interconnection/BLA1 through contact C1, and the first metal interconnection/BLA1 is electrically connected to a second metal interconnection serving as bit line/BLA through first via hole T1. N-type diffusion region FL4 is electrically connected to a first metal interconnection GND1 through contact C1, and the first metal interconnection GND1 is electrically connected to a second metal interconnection serving as a ground line GND through first via hole T1.

N-type diffusion region FL3 is electrically connected to a first-metal interconnection BLB1 through contact C1, and the first metal interconnection BLB1 is electrically connected to a second metal interconnection serving as bit line BLB through first via hole T1. N-type diffusion region FL10 is electrically connected to a first metal interconnection/BLB1 through contact C1, and the first metal interconnection/BLB1 is electrically connected to a second metal interconnection serving as bit line/BLB through first via hole T1. N-type diffusion region FL1 is electrically connected to a first metal interconnection GND1 through contact C1, and the first metal interconnection GND1 is electrically connected to a second metal interconnection serving as ground line GND through first via hole T1.

All the second metal interconnections arranged in the memory cell region are arranged parallel to each other, and extend in the direction parallel to the boundary line between n-type well NW and p-type well PW0 and the boundary line between n-type well NW and p-type well PW1.

Gate PL4 is electrically connected to a first metal interconnection WLAa through a gate contact GC, the first metal interconnection WLAa is electrically connected to a second metal interconnection WLAb through first via hole T1, and the second metal interconnection WLAb is electrically connected to a third metal interconnection serving as word line WLA1 through a second via hole T2. Gate PL3 is electrically connected to a first metal interconnection WLBa through gate contact GC, the first metal interconnection WLBa is electrically connected to a second metal. interconnection WLBb through first via hole T1, and the second metal interconnection WLBb is electrically connected to a third metal interconnection serving as word line WLB1 through second via hole T2.

All the third metal interconnections arranged in the memory cell region are also arranged parallel to each other, and extend in the direction orthogonal to the boundary line between n-type well NW and p-type well PW0 and the boundary line between n-type well NW and p-type well PW1.

The layout configuration of memory cells MC1 and MC2 adjacent to each other will be described.

Referring to FIGS. 8 and 9, the planar layout configuration from the transistor formation layer to the second metal interconnection layer of memory cell MC2 adjacent to memory cell MC1 is line-symmetric to the planar layout of memory cell MC1 with respect to the boundary line (line X-X) between memory cell MC1 and memory cell MC2. As a result, GND line, VDD line, and bit line pairs BLA, /BLA, BLB, /BLB formed of the second metal interconnection layer are shared between memory cells adjacent to each other (for example between MC1 and MC2). Because of the line symmetrical arrangement, mismatch of characteristics such as a capacitance value can be minimized.

On the other hand, the planar layout configuration of second via hole T2 and the third metal interconnection layer in memory cell MC2 adjacent to memory cell MC1 is the same as the planar layout configuration of memory cell MC1. More specifically, in both memory cells MC1 and MC2, word lines WLA1, WLA2 formed of the third metal interconnection layer connected to the first port are arranged above word lines WLB1, WLB2, respectively, formed of the third metal interconnection layer connected to the second port, in the figure. In other words, each of word lines WLA1, WLA2 formed of the third metal interconnection layer connected to the first port and each of word lines WLB1, WLB2 formed of the third metal interconnection layer connected to the second port are arranged alternately.

The layout of memory cells configured as described above can reduce the noise on the word lines caused by the coupling capacitance and can prevent a malfunction without an increase in memory cell area, as described in the first embodiment.

(Third Embodiment)

In the present embodiment, a two-port SRAM memory cell with a read-only port, which is a different type from the first and second embodiments, will be described.

Figure 11:
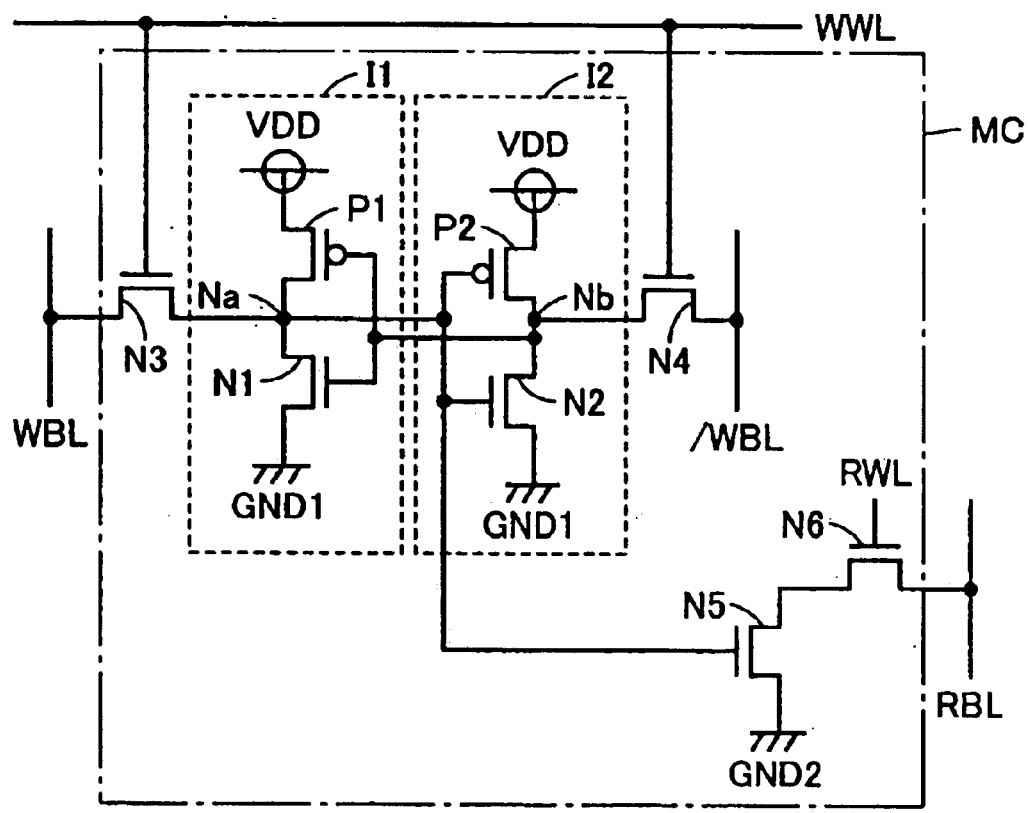
FIG. 11 is a circuit diagram showing an equivalent circuit of the two-port SRAM memory cell in a third embodiment of the present invention.

Referring to FIG. 11, this memory cell MC has two driver transistors N1, N2, two load transistors P1, P2, two access transistors N3, N4, and nMOS transistors N5, N6 constituting a read-only port.

Each of two driver transistors N1, N2, two access transistors N3, N4, and transistors N5, N6 is formed of an nMOS transistor, and each of two load transistors P1, P2 is formed of a pMOS transistor.

NMOS transistor N1 and PMOS transistor P1 constitute a first CMOS inverter I1, and NMOS transistor N2 and pMOS transistor P2 constitute a second CMOS inverter I2. A flip-flop circuit as well as storage nodes Na, Nb are formed by connecting the output terminal of one of first and second inverters I1, I2 to the input terminal of the other.

The source of each of driver transistors N1, N2 is connected to GND potential, and the source of each of load transistors P1, P2 is connected to VDD potential.

The source, gate, and drain of nMOS transistor N3 are connected to one storage terminal Na, write word line WWL, and one write bit line WBL, respectively. The source, gate, and drain of nMOS transistor N4 are connected to the other storage terminal Nb, write word line WL, and the other write bit line/WBL.

NMOS transistors N3, N4, write word line WWL, and write bit line pair WBL, /WBL are connected to the first port. A stable writing/reading operation in a differential manner can be performed since two access transistors in a memory cell are connected to the first port in this way.

NMOS transistors N5, N6, read bit line RBL, and read word line RWL are connected to the second port. The drain of nMOS transistor N5 and the source of nMOS transistor N6 are connected together. The source and gate of nMOS transistor N5 are connected to ground line GND2 and storage node Nb, respectively. The drain and gate of nMOS transistor N6 are connected to read bit line RBL and read word line RWL, respectively.

The two-port SRAM memory cell circuit with a read-only port is configured by the connection as described above.

An exemplary circuit operation will now be described using an equivalent circuit diagram in FIG. 11.

First, a case where hold data is read at the first port will be described. Word line WWL is initially at "L" level and access transistor N3 is in the hold state of OFF state. Upon the start of the reading operation, word line WWL goes to "H" level, and access transistor N3 enters ON state. Then, storage node Na and bit line WBL become electrically connected to each other. Assuming that storage node Na holds "H" level, "H" level is read onto bit line WBL. On the contrary, assuming that storage node Na holds "L" level, "L" level is read onto bit line WBL. Thereafter, word line WWL returns to "L" level and access transistor N3 enters OFF state to return to the hold state again.

A writing operation at the first port will now be described. Where "H" level is written to storage node Na, bit line WBL is driven at "H" level, and where "L" level is written, bit line WBL is driven at "L" level, by the driver circuit (not shown). When word line WWL is driven from "L" level to "H" level, access transistor N3 changes from OFF state to ON state, and bit line WBL and storage node Na become electrically connected to each other. Since bit line WBL is driven strongly, storage node Na changes to the level on bit line WBL, irrespective of the hold data. For example, when bit line WBL is driven at "L" level, storage node Na also goes to "L" level and the opposite storage node Nb goes to "H" level. On the contrary, when bit line WBL is driven at "H" level, storage node Na also goes to "H" level and the opposite storage node Nb goes to "L" level. Thereafter, as write word line WWL goes from "H" level to "L" level, and access transistor N3 enters OFF state, each of storage nodes Na, Nb is stabilized at the written level thereby holding data. The writing operation is now completed.

A reading operation at the second port will now be described.

In a case of the non-reading state, read bit line RBL is precharged to "H" level in advance. Read word line RWL is at "L" level. Namely, nMOS transistor N6 is in OFF state. Assuming that storage node Na is at H level, nMOS transistor N5 is in ON state.

Upon the start of the reading operation, when read word line RWL changes from "L" level to "H" level, nMOS transistor N6 changes from OFF state to ON state. Then, read bit line RBL and ground line GND2 are electrically rendered conductive through nMOS transistors N5, N6, so that read bit line RBL changes from "H" level of the precharge level to "L" level, and "L" level of the inversion data of storage node Na is read out. Thereafter, when word line RWL returns from "H" level to "L" level, nMOS transistor N6 enters OFF state, and read bit line RBL is electrically cut off from ground line GND2. Then, read bit line RBL is precharged to "H" level again for the next reading operation, thereby completing the reading operation.

On the other hand, assuming that storage node Na is at "L" level, NMOS transistor N5 is in OFF state. Upon the start of the reading operation, when read word line RWL changes from "L" level to "H" level, NMOS transistor N6 changes from OFF state to ON state while NMOS transistor N5 is in OFF state, so that read bit line RBL is not changed from "H" level of the precharge level. Thus, "H" level of the inversion data of storage node Na is read out. Thereafter, word line RWL returns from "H" level to "L" level, thereby completing the reading operation.

As described above, a writing operation is not allowed and only a reading operation is performed at the second port.

The planar layout configuration of the aforementioned two-port SRAM memory cell will now be described.

First, the layout configuration of memory cell MC1 of one bit will be described.

Figure 12:
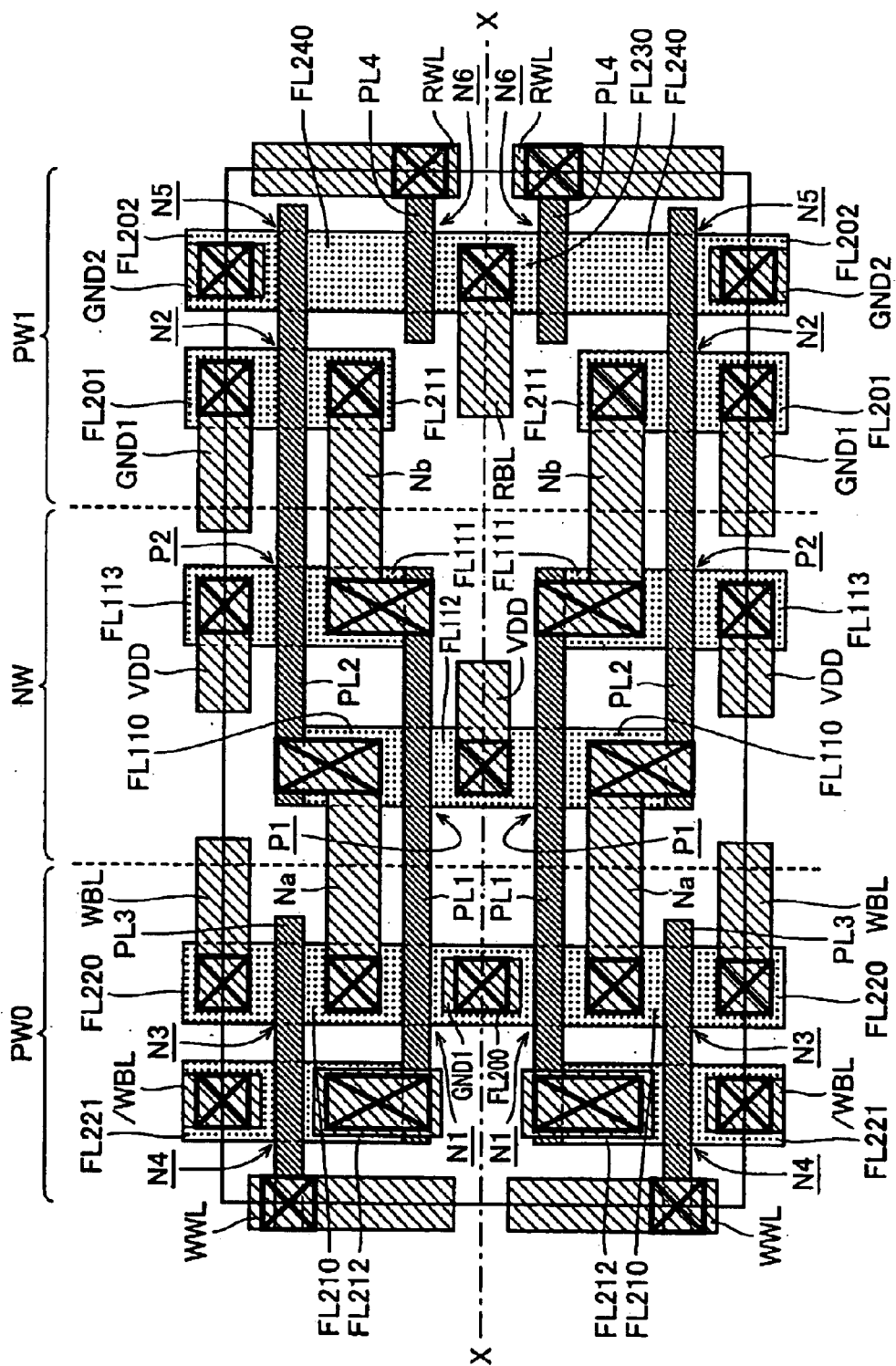
FIG. 12 is a planar view showing an exemplary layout configuration from a transistor formation layer to a first metal interconnection layer where two bits of the two-port SRAM memory cells are arranged in the same column in the third embodiment of the present invention.

Referring mainly to FIG. 12, one n-type well region NW, and two p-type well regions PW0, PW1 with this n-type well region NW interposed therebetween are formed on a surface of a semiconductor substrate. PMOS transistors P1, P2 are formed in n-type well NW. NMOS transistors N1, N3, N4 are formed in p-type well PW0, and nMOS transistors N2, N5, N6 are formed in p-type well PW1.

PMOS transistor P1 has the source formed of a p-type diffusion region FL112, the drain formed of FL110, and gate PL1. PMOS transistor P2 has the source formed of a p-type diffusion region FL113, the drain formed of a p-type diffusion region FL111, and gate PL2.

NMOS transistor N1 has the source formed of an n-type diffusion region FL200, the drain formed of an n-type diffusion region FL210, and gate PL1. NMOS transistor N2 has the source formed of an n-type diffusion region FL201, the drain formed of an n-type diffusion region FL211, and gate PL2.

NMOS transistor N3 has the source formed of an n-type diffusion region FL210, the drain formed of an n-type diffusion region FL220, and gate PL3. NMOS transistor N4 has the source formed of an n-type diffusion region FL212, the drain formed of an n-type diffusion region FL221, and gate PL3.

NMOS transistor N5 has the source and drain formed of a pair of n-type diffusion regions FL202 and FL240, and gate PL2. NMOS transistor N6 has the source and drain formed of a pair of n-type diffusion regions FL240 and FL230, and gate PL4.

Each n-type diffusion region is formed by implanting an n-type impurity into the active region of p-type wells PW0, PW1. Each p-type diffusion region is formed by implanting a p-type impurity into the active region of n-type well NW.

N-type diffusion region FL210 of nMOS transistor N1 and n-type diffusion region FL210 of nMOS transistor N3 are formed of a common diffusion region. N-type diffusion region FL240 of nMOS transistor N5 and n-type diffusion region FL240 of nMOS transistor N6 are formed of a common diffusion region.

Gates PL1 of pMOS transistor P1 and NMOS transistor N1 are formed of a common doped polysilicon interconnection. Gates PL2 of pMOS transistor P2 and nMOS transistors N2 and N5 are formed of a common doped polysilicon interconnection. Gates PL3 of nMOS transistors N3 and N4 are formed of a common doped polysilicon interconnection.

Gate PL2, p-type diffusion region FL110, and n-type diffusion region FL210 are electrically connected at low impedance by a first metal interconnection corresponding to storage terminal Na through contact holes. Gate PL1, p-type diffusion region FL111, and n-type diffusion region FL211 are electrically connected at low impedance by a first metal interconnection corresponding to storage terminal Nb through contact holes. Gate PL1 is also electrically connected to n-type diffusion region FL212.

Figure 13:
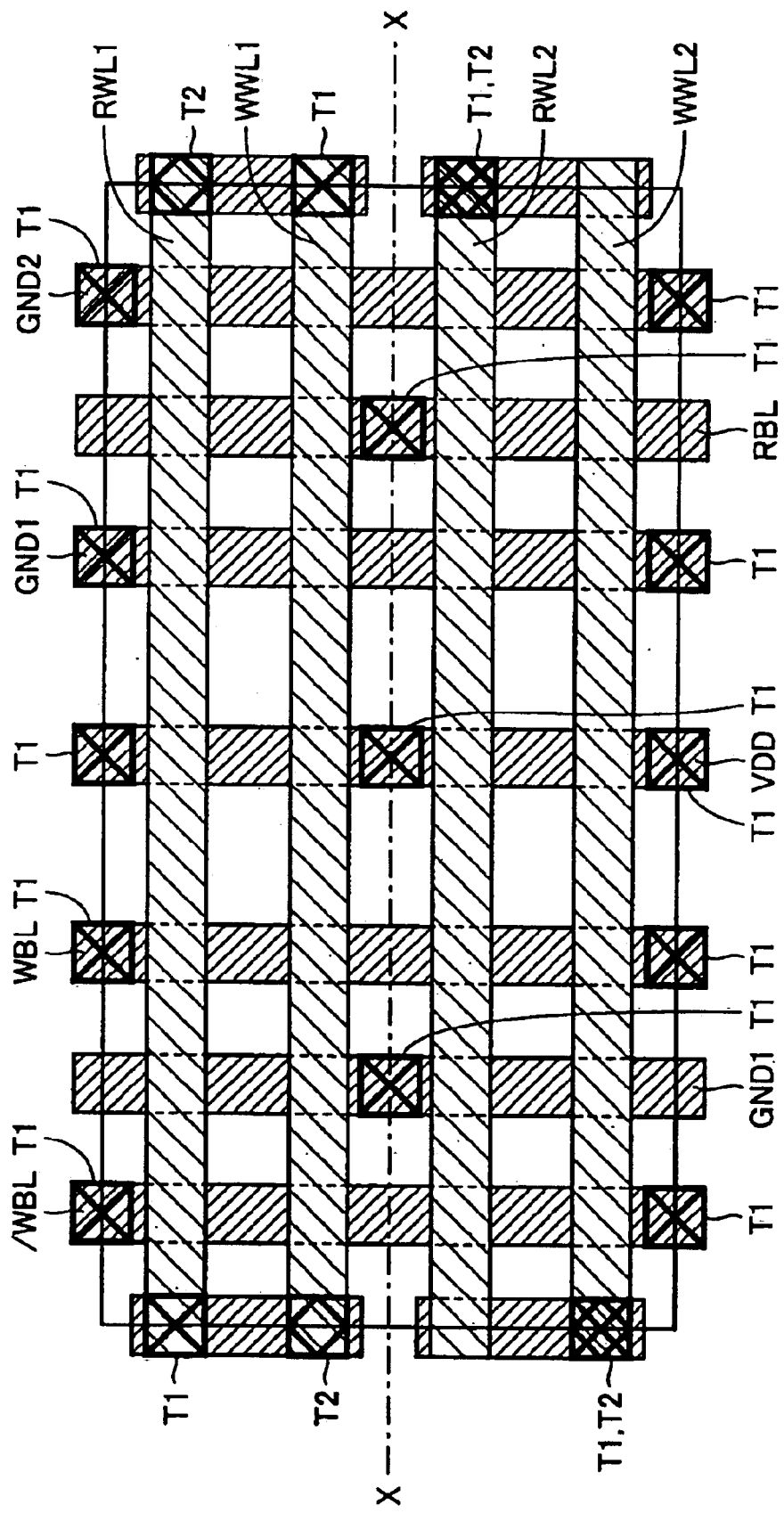
FIG. 13 is a planar view showing an exemplary layout configuration from a first via hole to a third metal interconnection layer where two bits of the two-port SRAM memory cells are arranged in the same column in the third embodiment of the present invention.
Figure 14:
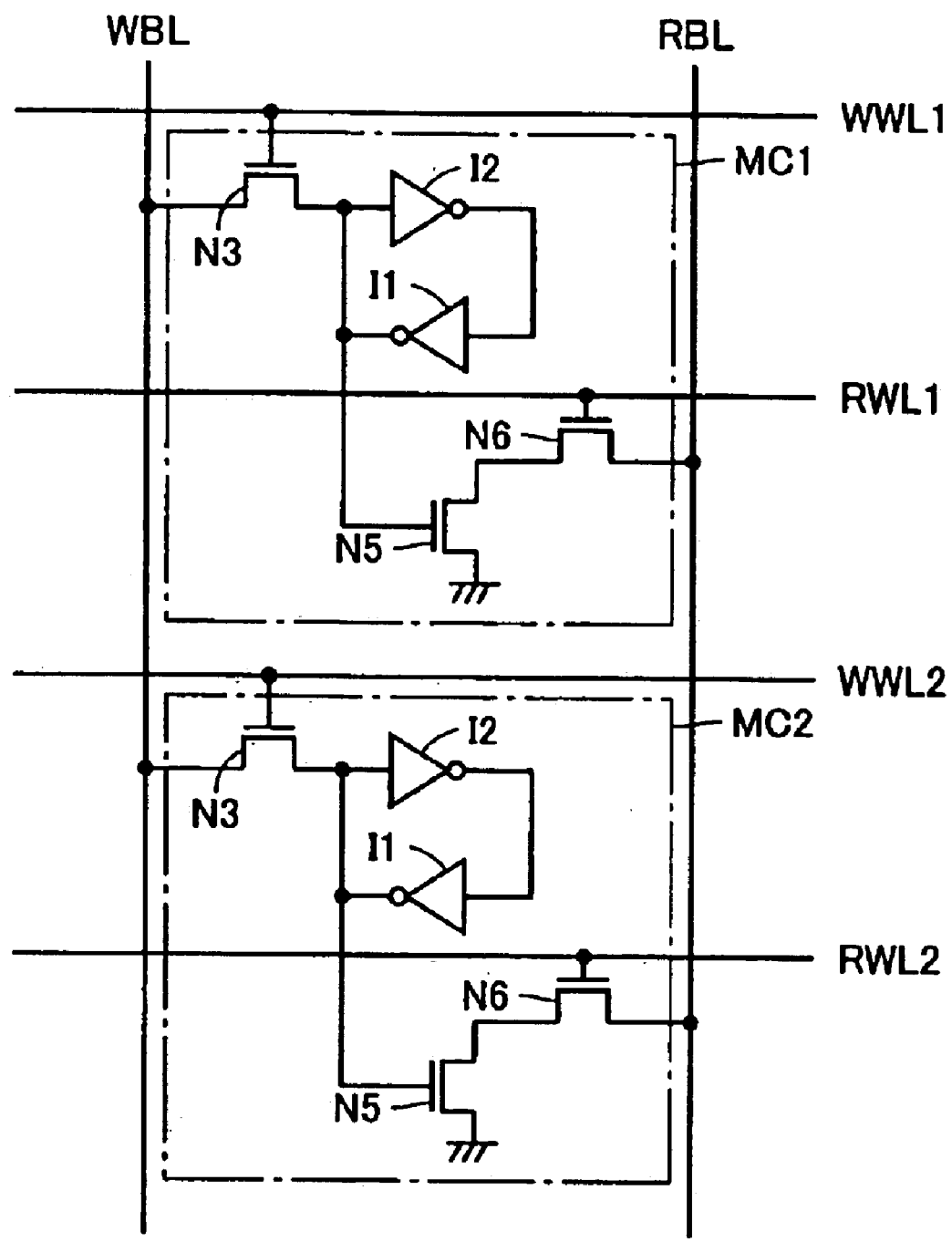
FIG. 14 is a circuit diagram showing an equivalent circuit of two bits of memory cells in FIGS. 12 and 13.

Referring mainly to FIGS. 12 and 13, p-type diffusion regions FL112 and FL113 are electrically connected to separate first metal interconnections through contact holes. Each of the separate first metal interconnections is electrically connected to a second metal interconnection serving as VDD potential through first via hole T1.

N-type diffusion region FL220 is electrically connected to a first metal interconnection through a contact hole. The first metal interconnection is electrically connected to a second metal interconnection serving as write word line WBL of the first port through first via hole T1. N-type diffusion region FL221 is electrically connected to a first metal interconnection through a contact hole, and the first metal interconnection is electrically connected to a second metal interconnection serving as write bit line /WBL of the first port through first via hole T1. N-type diffusion region FL200 is electrically connected to a first metal interconnection though a contact hole, and the first metal interconnection is electrically connected to a second metal interconnection serving as ground line GND1 through first via hole T1.

N-type diffusion region FL230 is electrically connected to a first metal interconnection through a contact hole, and the first metal interconnection is electrically connected to a second metal interconnection serving as read bit line RBL of the second port through first via hole T1. N-type diffusion region FL201 is electrically connected to a first metal interconnection through a contact hole, and the first metal interconnection is electrically connected to a second metal interconnection serving as ground line GND1 through first via hole T1. N-type diffusion region FL202 is electrically connected to a first metal interconnection through a contact hole, and the first metal interconnection is electrically connected to a second metal interconnection serving as ground line GND2 through first via hole T1.

All the second metal interconnections arranged within the memory cell region are arranged parallel to each other, and extend in the direction parallel to the boundary line between n-type well NW and p-type well PW0 and the boundary line between n-type well NW and p-type well PW1.

Gate PL3 is electrically connected to a first metal interconnection through a contact hole, and the first metal interconnection is electrically connected to a second metal interconnection through first via hole T1. The second metal interconnection is electrically connected to a third metal interconnection serving as write word line WWL of the first port through second via hole T2. Gate PL4 is electrically connected to a first metal interconnection through a contact hole, and the first metal interconnection is electrically connected to a second metal interconnection through first via hole T1. The second metal interconnection is electrically connected to a third metal interconnection serving as read word line RWL of the second port through second via hole T2.

All the third metal interconnections arranged within the memory cell region are also arranged parallel to each other, and extend in the direction orthogonal to the boundary line between n-type well NW and p-type well PW0 and the boundary line between n-type well NW and p-type well PW1.

The layout configuration of memory cells MC1 and MC2 adjacent to each other will now be described.

Referring to FIGS. 12 and 13, the planar layout configuration from the transistor formation layer to the second metal interconnection layer of memory cell MC2 adjacent to memory cell MC1 is line-symmetric to the planar layout of memory cell MC1 with respect to the boundary line (line X-X) between memory cell MC1 and memory cell MC2. Therefore, GND1 line, GND2 line, VDD line, and bit lines WBL, /WBL, RBL formed of the second metal interconnection layer are shared between the adjacent memory cells (for example, between MC1 and MC2).

On the other hand, the planar layout configuration of each of the second via hole T2 and the third metal interconnection layer of memory cell MC2 adjacent to memory cell MC1 is the same as the planar layout configuration of memory cell MC1. More specifically, in both memory cell MC1 and memory cell MC2, word lines RWL1, RWL2 formed of the third metal interconnection layer connected to the second port are arranged above word lines WWL1, WWL2, respectively, formed of the third metal interconnection layer connected to the first port, in the figure. In other words, each of word lines RWL1, RWL2 formed of the third metal interconnection layer connected to the second port and each of word lines WWL1, WWL2 formed of the third metal interconnection layer connected to the first port are arranged alternately.

The memory cell layout configured as described above can reduce the noise on word lines due to the coupling capacitance, as described in the first embodiment, and can prevent a malfunction without increasing the memory cell area.

(Fourth Embodiment)

The present embodiment relates to a CAM (Content Addressable Memory). Recently, increased speed of computers requires cache memory to be mounted on chips. Since it takes much time to access a bulk memory external to a chip, a CPU is accelerated by employing a scheme in which data stored in a certain address space in that external memory is transferred to a fast cache memory within the chip. In doing so, it is necessary to make a search instantaneously to see whether data is transferred to the cache memory. It is a content addressable memory that has this comparing and matching search function.

Figure 15:
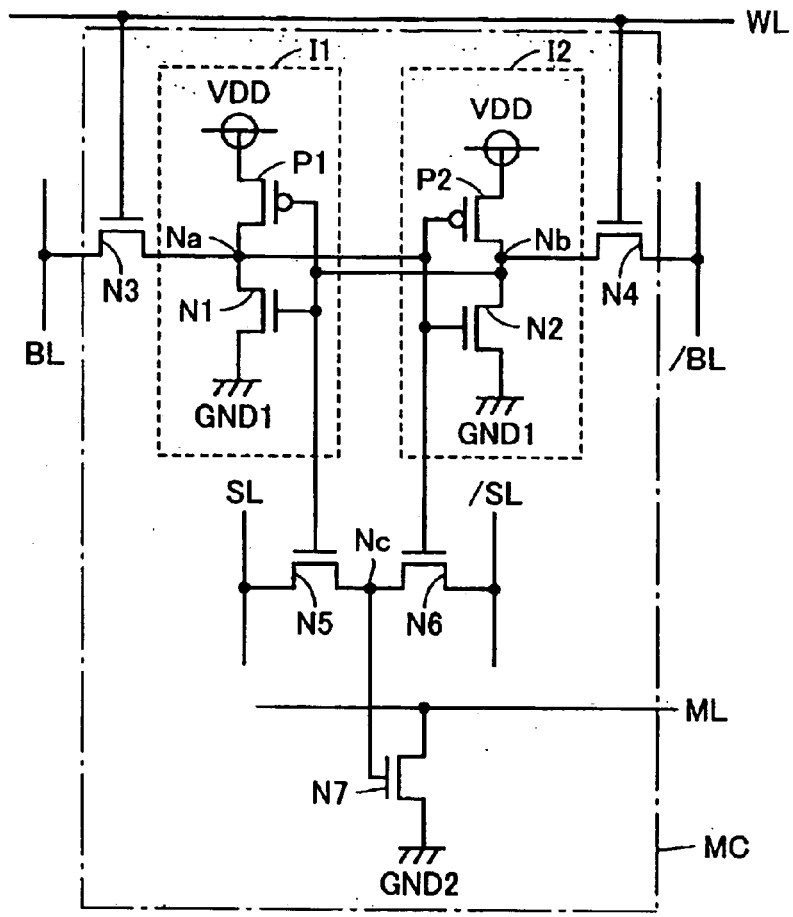
FIG. 15 is a circuit diagram showing an equivalent circuit of a memory cell in a content addressable memory in a fourth embodiment of the present invention.

Referring to FIG. 15, a memory cell has two driver transistors N1, N2, two load transistors P1, P2, two access transistors N3, N4, and nMOS transistors N5–N7. Each of two driver transistors N1, N2 and two access transistors N3, N4 is formed of an nMOS transistor. Each of two load transistors P1, P2 is formed of a PMOS transistor.

NMOS transistor N1 and pMOS transistor P1 constitute a first CMOS inverter I1, and nMOS transistor N2 and pMOS transistor P2 constitute a second CMOS inverter I2. A flip-flop circuit and storage nodes Na, Nb are formed by connecting the output terminal of one of first and second inverters I1, I2 to the input terminal of the other.

The source of each of driver transistors N1, N2 is connected to a GND potential, and the source of each of load transistors P1, P2 is connected to a VDD potential.

The source, gate, and drain of nMOS transistor N3 is connected to one storage terminal Na, word line WL and one positive-phase bit line BL, respectively. The source, gate, and drain of NMOS transistor N4 are connected to the other storage terminal Nb, word line WL, and the other negative-phase bit line/BL, respectively.

An internal node Nc is formed by electrically connecting the drains of nMOS transistors N5, N6 to each other. The source and gate of NMOS transistor N5 are connected to a search line SL and storage node Nb, respectively. The source and gate of nMOS transistor N6 are electrically connected to a search line/SL and storage node Na, respectively. The gate, source, and drain of nMOS transistor N7 are connected to internal node Nc, a ground line GND2, and a match line ML, respectively. The content addressable memory is thus configured.

It is noted that match line ML transmits a signal indicating that search data and storage data match or mismatch.

A comparison operation of the content addressable memory will now be described.

In the initial state, the search line pair SL and/SL both are at "L" level. Assuming that data at storage nodes Na, Nb are at "H" level and "L" level, respectively, nMOS transistor N6 is in ON state and nMOS transistor N5 is in OFF state. Therefore, internal node Nc is electrically connected with search line/SL through nMOS transistor N6 and goes to "L" level. Since nMOS transistor N7 is in OFF state, match line ML is electrically cut off from ground line GND2. Match line ML is precharged to "H" level in advance.

Upon the start of the comparison operation, either search line SL or /SL is driven from "L" level to "H" level in accordance with the data to be compared. Now assume that, as search data, search line SL is kept at "L" level and search line /SL is driven to "H" level, in order to make a comparison as to whether data held at storage node Na is "H" or "L". Then, as nMOS transistor N5 is in OFF state and nMOS transistor N6 is in ON state, internal node Nc electrically connected to search line /SL goes to "H" level, and nMOS transistor N7 enters ON state. Match line ML becomes electrically connected to ground line GND2 through nMOS transistor N7. Therefore, match line ML changes from the initial state "H" level to "L" level, resulting in information indicative of different comparison.

On the other hand, assume that, as search data, search line /SL is kept at "L" level and search line SL is driven to "H" level. In this case, internal node Nc goes to "L" level as it is electrically connected to search line /SL through nMOS transistor N6. NMOS transistor N7 is in OFF state, match line ML is electrically cut off from ground potential GND2, and match line ML is held at "H" level that is an initial precharge state. Information indicative of equal comparison thus results. Thereafter, search line pair SL and /SL both are driven back to "L" level, and match line ML is precharged again to "H" level, thereby completing the comparison operation.

It is noted that the normal reading and writing operations will not be described for convenience of illustration.

Figure 16:
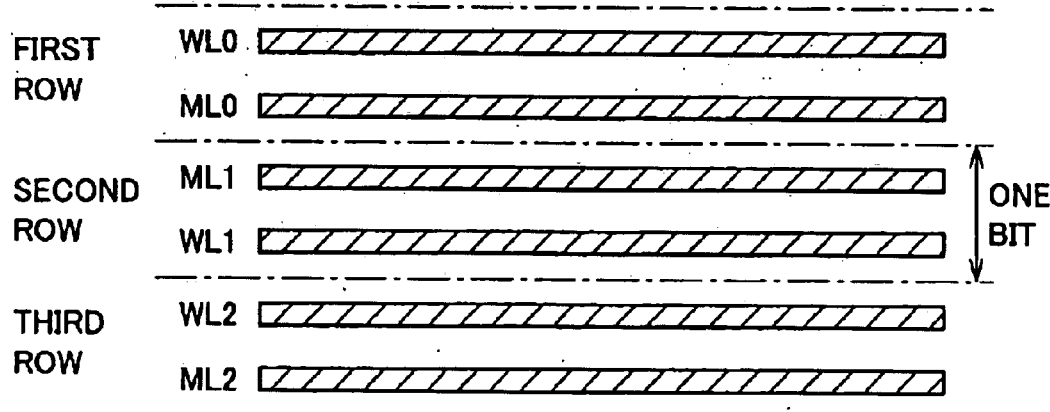
FIG. 16 is a planar layout diagram showing an arrangement of word lines and match lines where the content addressable memory cells are arranged in three rows in the fourth embodiment of the present invention.

Referring to FIG. 16, in the present embodiment, a word line and a match line extend parallel to each other for each row. The planar layouts of the word line and match line are line-symmetric to each other in the adjacent rows with respect to the boundary line (the dotted line) between the adjacent rows. More specifically, in the first and second rows adjacent to each other, match line ML0 in the first row and match line ML1 in the second row are adjacent to each other, and in the second and third rows adjacent to each other, word line WL1 in the second row and word line WL2 in the third row are adjacent to each other. This configuration is repeated. Therefore, the word lines and match lines are planarly arranged in the order of word line WL0, match line ML0, match line ML1, word line WL1, word line WL2, and match line ML2, from above in FIG. 16.

Figure 17:
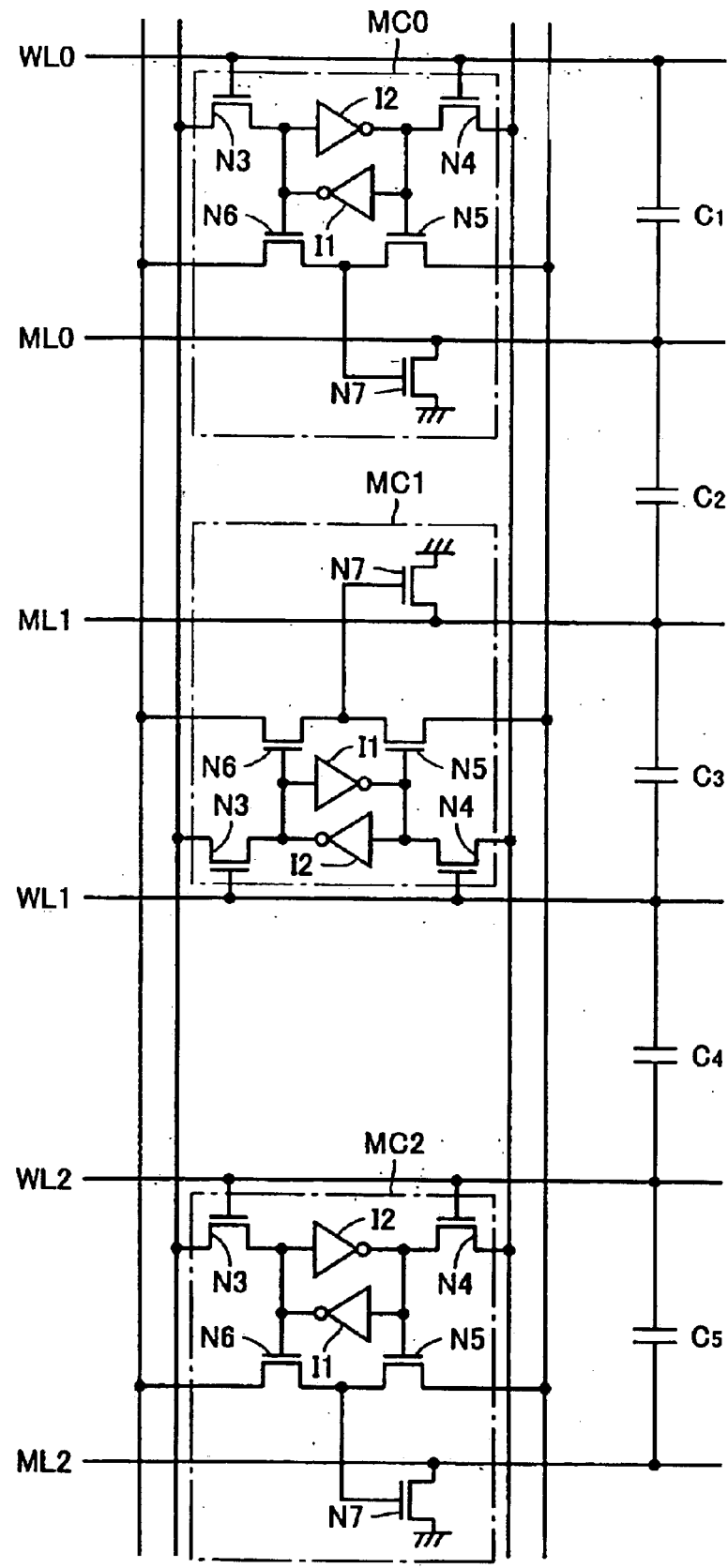
FIG. 17 is a diagram showing a circuit configuration of three bits in the content addressable memory in the fourth embodiment of the present invention.

In accordance with the present embodiment, the word lines and match lines planarly arranged as described above can reduce the effect of coupling noise between interconnections as shown in FIG. 17, similarly to the first embodiment. This will be described below.

The problem with the content addressable memory occurs when match line ML is precharged after the completion of the match comparison operation. In the match comparison operation, most of match lines ML that have been precharged to "H" level in advance change to "H" level. The match line ML in the row where a match occurs (at most only one row) holds "L" level, while all the match lines ML change to "L" level where a mismatch occurs. After the completion of the match comparison operation, the match line is precharged to "H" level again, and: therefore most of match lines ML change from "L" level to "H" level.

Consider a case where match lines ML1 and ML2 in FIG. 17 are precharged again after going to "L" level, by way of example. During the match comparison operation, the reading and writing operations are not performed at the same time. Therefore, all word lines WL0–WL2 are set at "L" level. When match lines ML1 and ML2 change from "L" level to "H" level, word lines WL1 and WL2 adjacent to each other also tend to change from "L" level to "H" level, because of coupling capacitance C3 and C5. However, word lines WL0–WL2, none of which are selected, are driven to "L" level by the word line driver circuit (not shown), and even if the potential is raised from "L" level momentarily, it soon returns to "L" level again. In other words, even if match line ML1 adjacent to word line WL1 on one side changes from "L" level to "H" level, the potential on word line WL2 adjacent on the other side hardly changes.

Therefore, due to the changed potential on match line ML1 on one side of word line WL1, word line WL1 is affected by coupling capacitance C3 between word line WL1 and match line ML1. Coupling capacitance C4 between word line WL1 and word line WL2 does not affect the potential on word line WL1, since the potential on word line WL2 on the other side of word line WL1 remains constant at "L" level. Accordingly, in the present embodiment, since word line WL1 is less affected by the coupling capacitance, as shown in FIG. 17, it is possible to reduce the coupling noise and can prevent a malfunction without increasing the memory cell area.

By contrast, if the word lines and the match lines were arranged in order as shown in the two-port memory in the first embodiment, the interconnections adjacent on both sides of each word line would be math lines, resulting in that the word line is affected by the coupling noise between the match lines on the opposite sides.

In this way, the present embodiment allows the coupling noise between the interconnections to be reduced without increasing the memory cell area, similarly to the first embodiment.

The planar layout configuration of the aforementioned content addressable memory cell will now be described.

First, the layout configuration of memory cell MC1 of one bit will be described.

Figure 18:
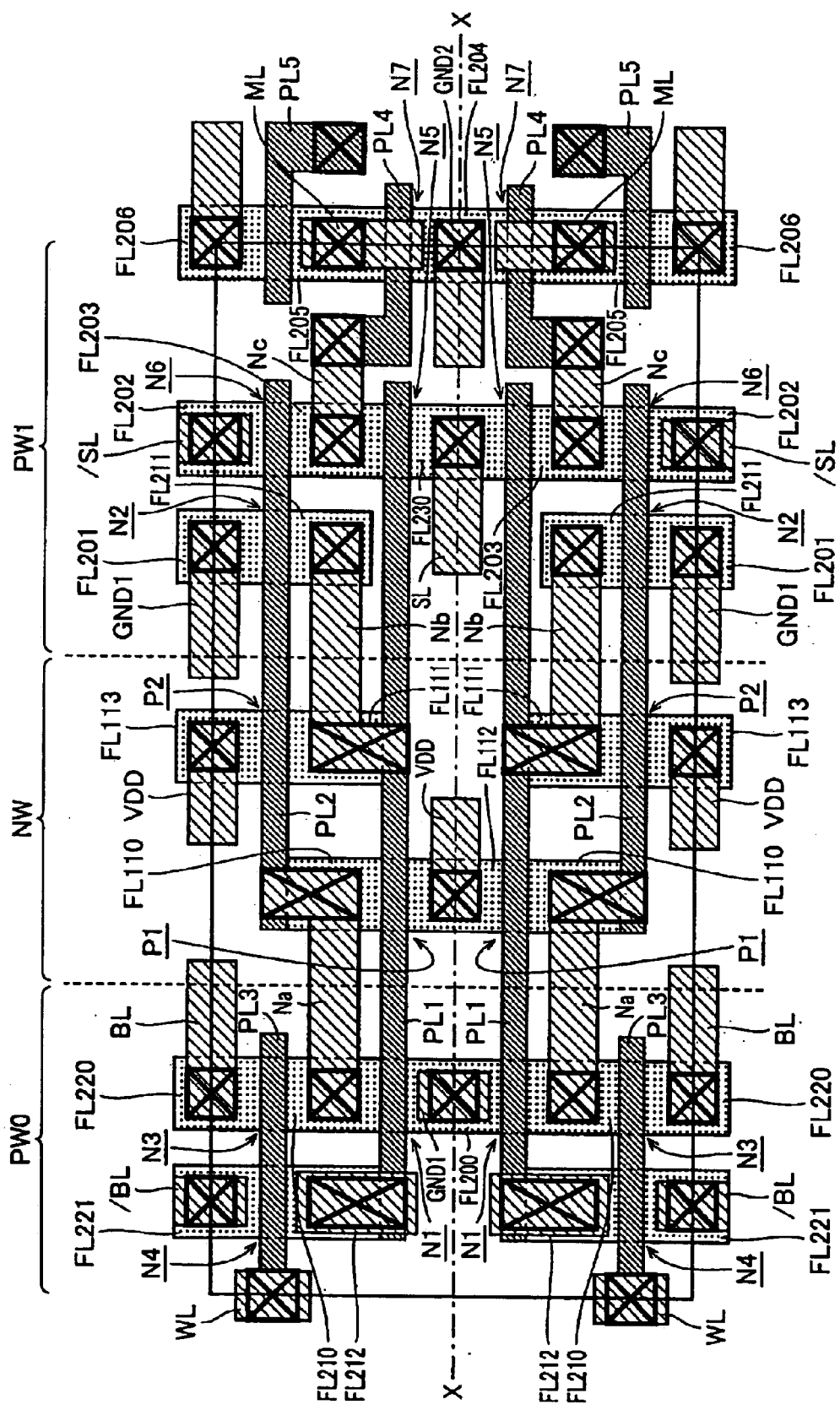
FIG. 18 is a planar view showing an exemplary layout configuration from a transistor formation layer to a first metal interconnection layer where two bits of the content addressable memory cells are arranged in the same column in the fourth embodiment of the present invention.
Figure 19:
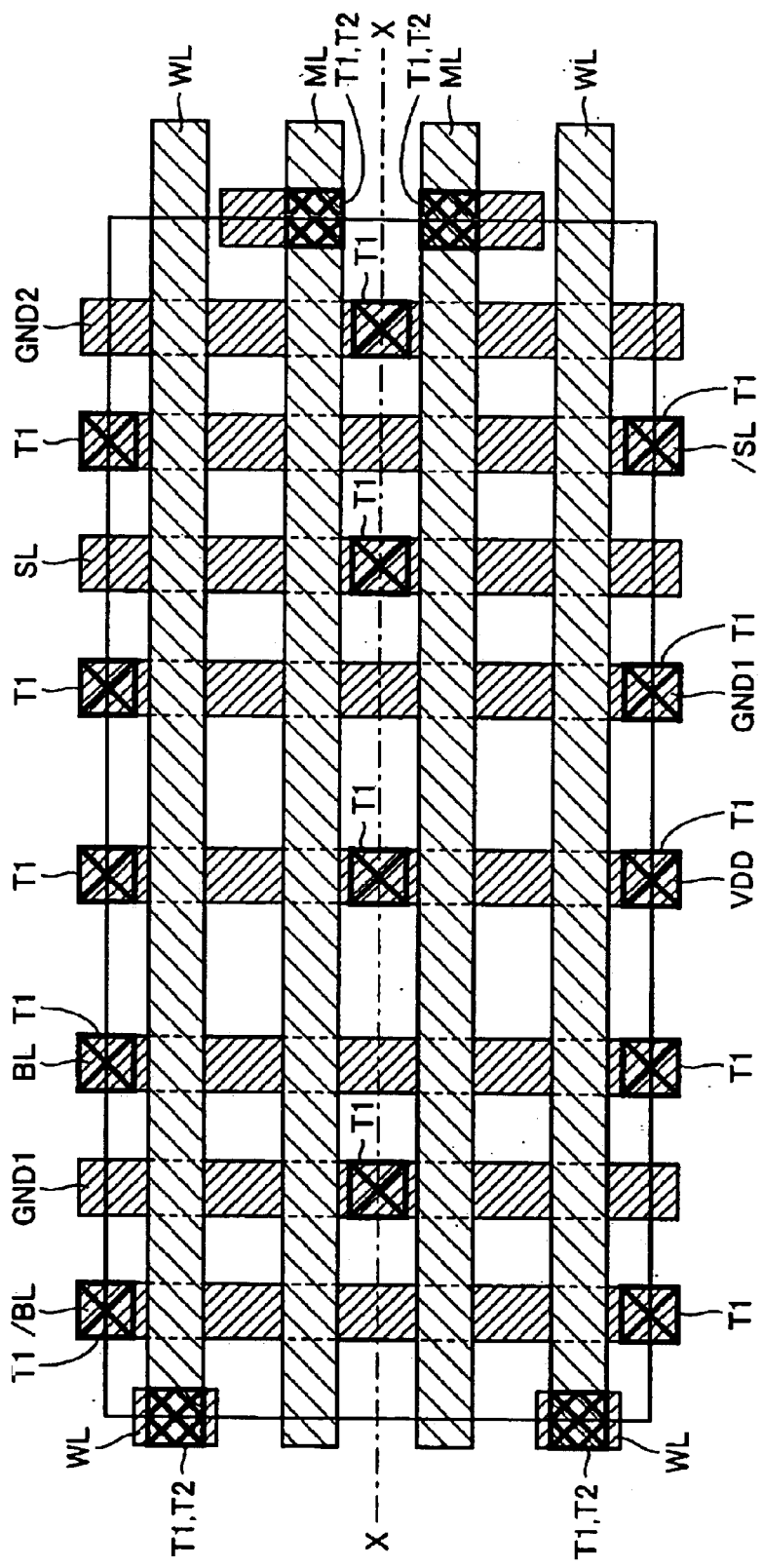
FIG. 19 is a planar view showing an exemplary layout configuration from a first via hole to a third metal interconnection layer where two bits of the content addressable memory cells are arranged in the same column in the fourth embodiment of the present invention.

Referring to FIGS. 15, 18 and 19, the layout configuration in this embodiment mainly differs from the configuration shown in FIGS. 11–13 in that nMOS transistors N5–N8 for the content addressable memory are provided in place of nMOS transistors N5, N6 constituting the read-only port and in that search line pair SL, /SL and match line ML are provided in place of read bit line RBL and read word line RWL.

Referring mainly to FIG. 18, each of nMOS transistors N5–N7 for the content addressable memory is formed within p-type well PW1. NMOS transistor N5 has the source and drain formed of a pair of n-type diffusion regions FL230, FL203, and gate PL1. NMOS transistor N6 has the source and drain formed of a pair of n-type diffusion regions FL202, FL203, and gate PL2. NMOS transistor N7 has the source and drain formed of a pair of n-type diffusion regions FL204, FL205, and gate PL4.

N-type diffusion regions FL203 of nMOS transistors N5 and N6 are formed of a common diffusion region and are electrically connected to gate PL4 by first metal interconnection Nc through contact holes. Gate PL1 of nMOS transistor N5, gate PL1 of nMOS transistor N1, and gate PL1 of pMOS transistor P1 are formed of a common doped polysilicon interconnection. Gate PL2 of nMOS transistor N6, gate PL2 of nMOS transistor N2, and gate PL2 of pMOS transistor P2 are formed of a common doped polysilicon interconnection.

Referring to FIGS. 18 and 19, n-type diffusion region FL230 is electrically connected to a first metal interconnection through a contact hole, and the first metal interconnection is electrically connected to a second metal interconnection serving as search line SL through first via hole T1. N-type diffusion region FL202 is electrically connected to a first metal interconnection through a contact hole, and the first metal interconnection is electrically connected to a second interconnection serving as search line /SL through first via hole T1. N-type diffusion region FL204 is electrically connected to a first metal interconnection through a contact hole, and the first metal interconnection is electrically connected to a second metal interconnection serving as ground line GND2 through first via hole T1. These second metal interconnections extend parallel to each other.

N-type diffusion region FL205 is electrically connected to a first metal interconnection through a contact hole, the first metal interconnection is electrically connected to a second metal interconnection through first via hole T1, and the second metal interconnection is electrically connected to a third metal interconnection serving as match line ML through second via hole T2. This match line ML extends parallel to word line WL.

The layout configuration of memory cells MC1 and MC2 adjacent to each other will now be described.

Referring to FIGS. 18 and 19, the planar configuration from the transistor formation layer to the third metal interconnection layer of memory cell MC2 adjacent to memory cell MC1 is line-symmetric to the planar layout of memory cell MC1 with respect to the boundary line between memory cell MC1 and memory cell MC2 (line X—X). Accordingly, GND1 line, GND2 line, VDD line, and bit lines WBL, /WBL, RBL formed of the second metal interconnection layer are shared between the adjacent memory cells (for example, between MC1 and MC2).

In the first and second rows adjacent to each other, match line ML0 in the first row and match line ML1 in the second row are arranged adjacent to each other, and in the second and third rows adjacent to each other, word line WL1 in the second row and word line WL2 in the third row are arranged adjacent to each other.

It is noted that since the other layout configuration is generally the same as the configuration in FIGS. 12 and 13, the same components are denoted with the same reference characters and description thereof will not be repeated.

The memory cell layout configured as described above can reduce the noise on the word lines due to the coupling capacitance and can prevent a malfunction without increasing the memory cell area.

(Fifth Embodiment)

Figure 20:
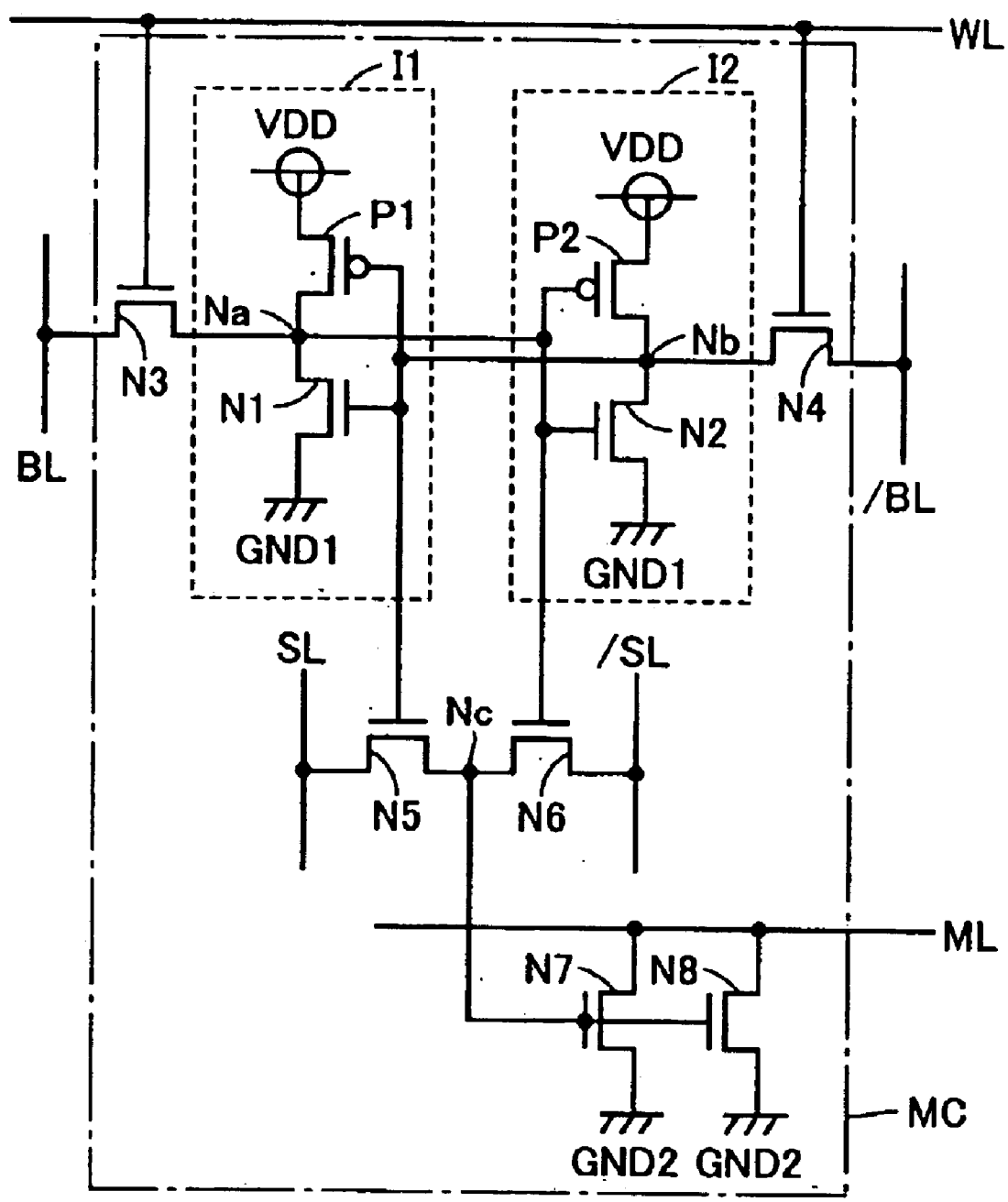
FIG. 20 is a circuit diagram showing an equivalent circuit of the content addressable memory cell in a fifth embodiment of the present invention.

Referring to FIG. 20, a configuration of an equivalent circuit in the present embodiment differs from the configuration in the fourth embodiment shown in FIG. 15 in that nMOS transistor N8 is additionally provided. The gate, source, and drain of NMOS transistor N8 are electrically connected to internal node Nc, ground potential GND2, and match line ML, respectively.

It is noted that since the other configuration of the equivalent circuit is generally the same as the configuration shown in FIG. 15, the same components are denoted with the same reference characters and description thereof will not be repeated.

In the present embodiment, the planar layouts of the word line and match line are line-symmetric to each other in the adjacent rows with respect to the boundary line between the adjacent rows (the dotted line) as shown in FIG. 16, similarly to the fourth embodiment. More specifically, in the first and second rows adjacent to each other, match line ML0 in the first row and match line ML1 in the second row are adjacent to each other, and in the second and third rows adjacent to each other, word line WL1 in the second row and word line WL2 in the third row are adjacent to each other. The word lines and the match lines are planarly arranged in the order of word line WL0, match line ML0, match line ML1, word line WL1, word line WL2, and match line ML2, from above in FIG. 16.

Figure 21:
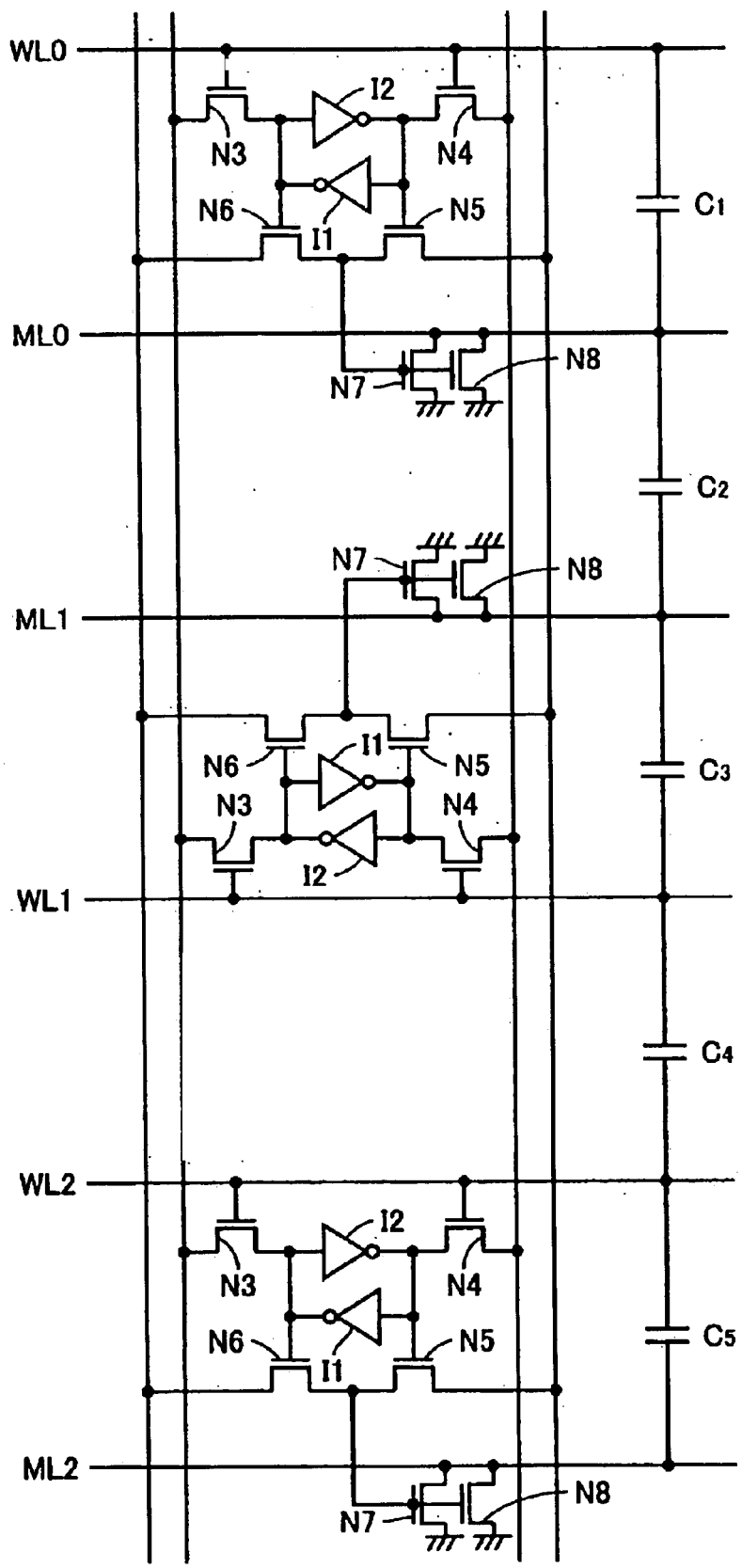
FIG. 21 is a diagram showing a circuit configuration of three bits in the content addressable memory in the fifth embodiment of the present invention.

The word lines and match lines planarly arranged in this manner can reduce the effect of the coupling noise between interconnections as shown in FIG. 21, similarly to the fourth embodiment.

In addition, the addition of NMOS transistor N8 can accelerate the switching of the potential on match line ML, thereby increasing the speed of the comparison operation.

The planar layout configuration of the aforementioned content addressable memory cell will now be described.

Figure 22:
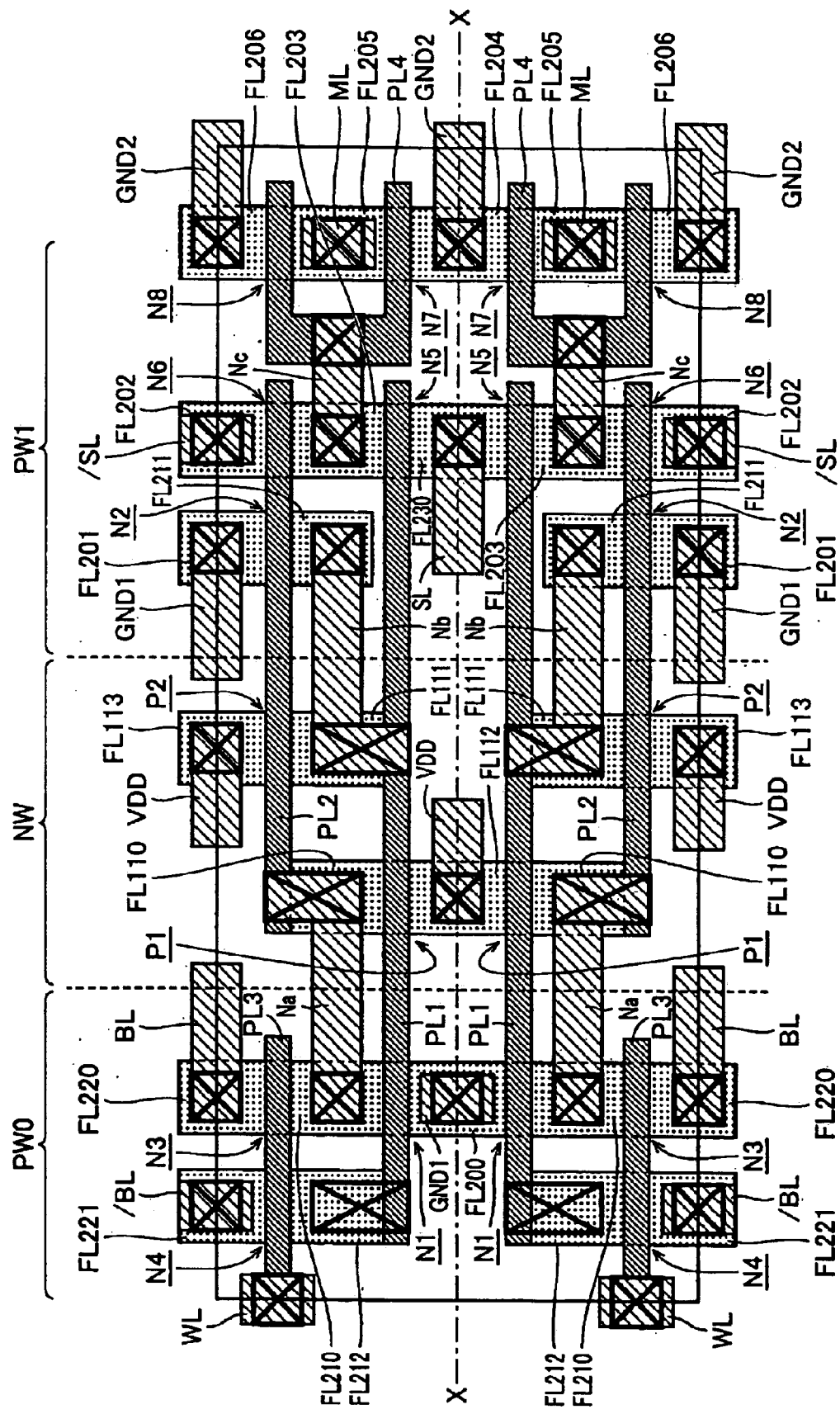
FIG. 22 is a planar view showing an exemplary layout configuration from a transistor formation layer to a first metal interconnection layer where two bits of the content addressable memory cells are arranged in the same column in the fifth embodiment of the present invention.

Referring to FIG. 22, the layout configuration in the present embodiment mainly differs from the configuration in FIGS. 18 and 19 in that NMOS transistor N8 is additionally provided.

NMOS transistor N8 is formed within p-type well PW1. NMOS transistor N8 has the source and drain formed of a pair of n-type diffusion regions FL206, FL205, and gate PL4.

N-type diffusion regions FL205 of NMOS transistors N7 and N8 are formed of a common diffusion region, and gates PL4 thereof are formed of a common doped polysilicon interconnection.

Figure 23:
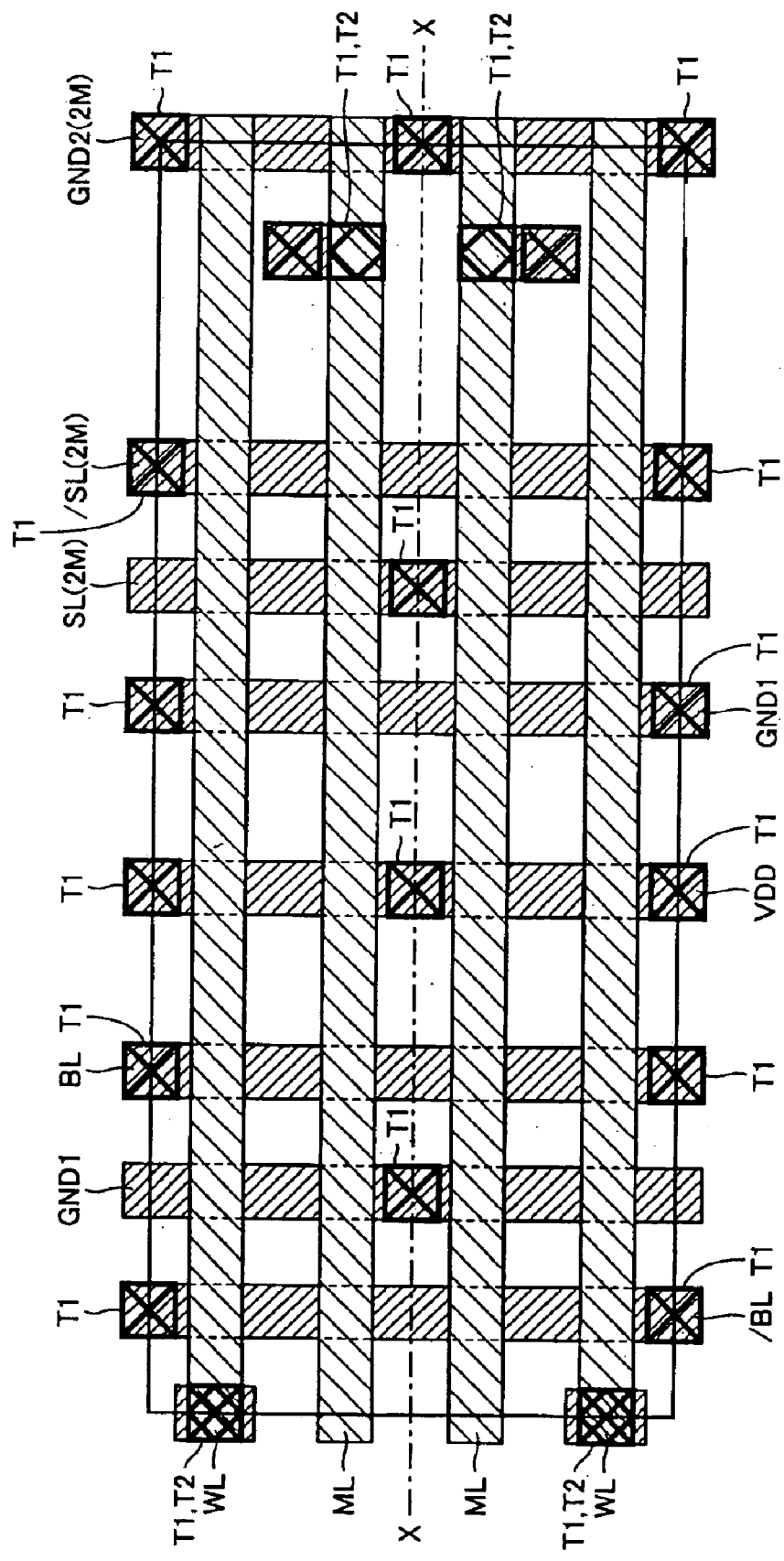
FIG. 23 is a planar view showing an exemplary layout configuration from a first via hole to a third metal interconnection layer where two bits of the content addressable memory cells are arranged in the same column in the fifth embodiment of the present invention.

Referring to FIGS. 22 and 23, n-type diffusion regions FL204 and FL206 are electrically connected to separate first metal interconnections through contact holes, and each of the separate first metal interconnections is electrically connected to a second metal interconnection serving as ground line GND2 through a first via hole.

It is noted that since the other configuration is generally the same as the configuration in FIGS. 18 and 19, the same components are denoted with the same reference characters and description thereof will not be repeated.

(Sixth Embodiment)

Figure 24:
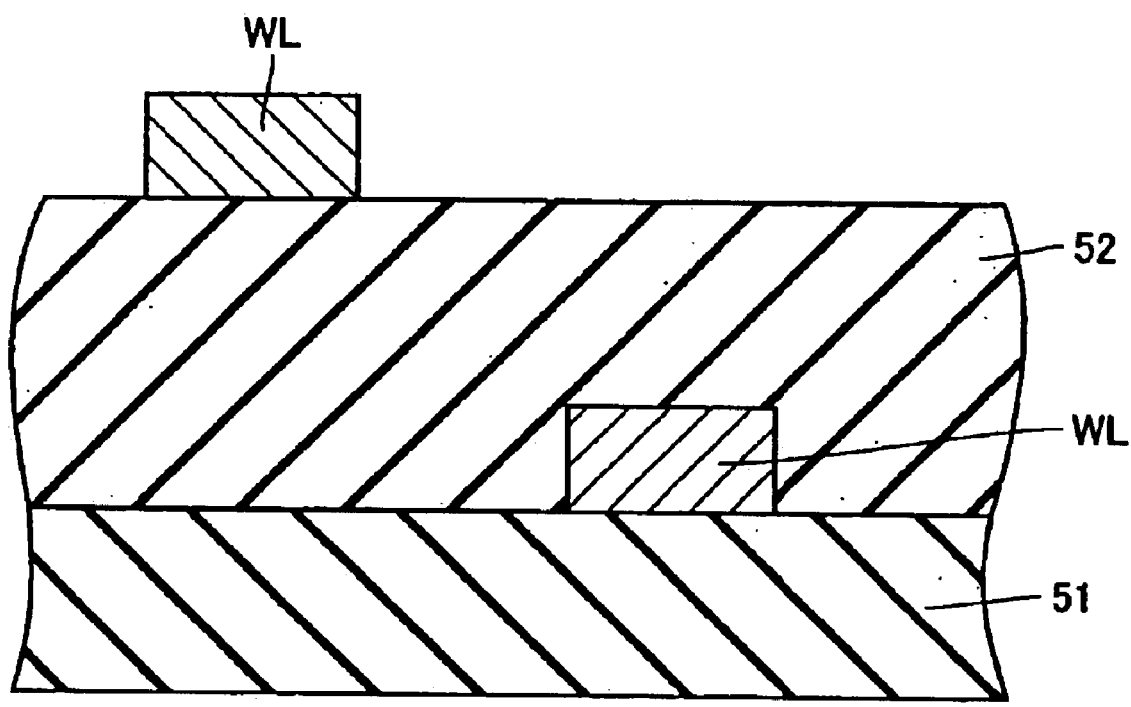
FIG. 24 is a cross sectional view schematically showing a configuration of a semiconductor memory device in a sixth embodiment of the present invention.

Although word lines WLA and WLB have been described as being formed on the same insulating layer in the second and third embodiments, word line WLA and word line WLB may be formed on different layers as shown in FIG. 24. Specifically, an insulating layer 52 may be formed on word line WLA formed on an insulating layer 51, and word line WLB may be formed on insulating layer 52. Alternatively, insulating layer 52 may be formed on word line WLB formed on insulating layer 51, and word line WLA may be formed on insulating layer 52. In other words, one of word line WLA and word line WLB may be arranged below insulating layer 52, and the other of word line WLA and word line WLB may be arranged above insulating layer 52. This can further reduce the coupling capacitance.

In addition, although word line WL and match line ML have been described as being formed on the same insulating layer in the fourth and fifth embodiments, word line WL and match line ML may be formed on different insulating layers as shown in FIG. 24. Specifically, insulating layer 52 may be formed on word line WL formed on insulating layer 51, and match line ML may be formed on insulating layer 52. Alternatively, insulating layer 52 may be formed on match line ML formed on insulating layer 51, and word line WL may be formed on insulating layer 52. In other words, one of word line WL and match line ML may be arranged below insulating layer 52, and the other of word line WL and match line ML may be arranged above insulating layer 52. This can further reduce the coupling capacitance.

Although in the first to fifth embodiments above, MOS transistor has been employed as a transistor, the transistor may be an MIS (Metal Insulator Semiconductor). As the conductivity type of each transistor, p-type and n-type may be reversed.

Although in the first to third embodiments above, a two-port memory cell has been described, the present invention can be applied to a multiport memory cell having two or more ports.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a multiport memory comprising:

a plurality of memory cells arranged in columns and rows;

a plurality of first word lines each arranged corresponding to each row, electrically connected to said memory cells, and selected in accordance with an address signal from a first port when accessed from said first port; and a plurality of second word lines each arranged corresponding to each row, electrically connected to said memory cells, and selected in accordance with an address signal from a second port when accessed from said second port, wherein each of said plurality of first word lines and each of said plurality of second word lines are arranged alternately in a planar layout.

2. The semiconductor memory device according to claim 1, wherein respective planar layouts of transistors in two said memory cells adjacent to each other in a row direction in a same column are line-symmetric to each other with respect to a boundary line between said two memory cells.

3. The semiconductor memory device according to claim 1 further comprising an insulating layer arranged between said first word line and said second word line, wherein one of said first word line and said second word line is arranged below said insulating layer, and the other of said first word line and said second word line is arranged above said insulating layer.

4. A semiconductor memory device having a content addressable memory, comprising:

a plurality of content addressable memory cells arranged in columns and rows;

a plurality of word lines each arranged corresponding to each row and electrically connected to said content addressable memory cell; and a plurality of match lines each arranged corresponding to each row and electrically connected to said content addressable memory cell, wherein in a first row and a second row adjacent to each other, said word line in said first row and said word line in said second row are adjacent to each other, and in said second row and a third row adjacent to each other, said match line in said second row and said match line in said third row are adjacent to each other.

5. The semiconductor memory device according to claim 4 further comprising an insulating layer arranged between said word line and said match line, wherein one of said word line and said match line is arranged below said insulating layer, and the other of said word line and said match line is arranged above said insulating layer.

* * * * *